(12) United States Patent
Wang

(10) Patent No.: US 9,595,330 B2
(45) Date of Patent: Mar. 14, 2017

(54) CONFIGURABLE NON-VOLATILE CONTENT ADDRESSABLE MEMORY

(71) Applicant: FLASHSILICON INCORPORATION, Diamond Bar, CA (US)

(72) Inventor: Lee Wang, Diamond Bar, CA (US)

(73) Assignee: FLASHSILICON INCORPORATION, Diamond Bar, CA (US)

( * ) Notice: Subject to any disclaimer, the term of this patent is extended or adjusted under 35 U.S.C. 154(b) by 0 days.

(21) Appl. No.: 15/283,802

(22) Filed: Oct. 3, 2016

(65) Prior Publication Data

US 2017/0025175 A1 Jan. 26, 2017

Related U.S. Application Data

(62) Division of application No. 14/596,886, filed on Jan. 14, 2015, now Pat. No. 9,502,113.

(51) Int. Cl.
*G11C 15/04* (2006.01)

(52) U.S. Cl.
CPC .................. *G11C 15/046* (2013.01)

(58) Field of Classification Search
CPC .......... G11C 15/046; G11C 15/00; G11C 5/06
See application file for complete search history.

(56) References Cited

U.S. PATENT DOCUMENTS

| | | | |
|---|---|---|---|
| 5,111,427 A | 5/1992 | Kobayashi | |
| 5,808,929 A | 9/1998 | Sheikhholeslami | |
| 6,775,168 B1* | 8/2004 | Park ....................... | G11C 15/00 365/189.07 |
| 8,817,546 B2 | 8/2014 | Wang | |
| 9,082,490 B2 | 7/2015 | Wang | |
| 2004/0130925 A1 | 7/2004 | De Sandre | |
| 2004/0136217 A1* | 7/2004 | de Sandre ............ | G11C 15/046 365/49.17 |
| 2012/0191902 A1* | 7/2012 | Lee ..................... | G06F 12/1425 711/103 |
| 2015/0161060 A1 | 6/2015 | Suzuki | |

* cited by examiner

*Primary Examiner* — Tuan T Nguyen

(74) *Attorney, Agent, or Firm* — Muncy, Geissler, Olds & Lowe, P.C.

(57) ABSTRACT

A Configurable Non-Volatile Content Addressable Memory (CNVCAM) cell consisting of a pair of complementary non-volatile memory devices and a MOSFET (Metal-Oxide-Semiconductor-Field-Effect-Transistor) is disclosed. The CNVCAM cells can be constructed to form the NOR-type match line memory array and the NAND-type match line memory array. In contrast to the Random Access Memory (RAM) accessed by the address codes with the prior knowledge of memory locations, CNVCAM can be pre-configured into non-volatile memory content data and searched by an input content data to trigger the further computing process. The unique property of CNVCAM can provide a key component for neural computing.

16 Claims, 16 Drawing Sheets

NAND-type Array Cell

NOR-type Array Cell

CONFIGURABLE NON-VOLATILE CONTENT ADDRESSABLE MEMORY

This application is a divisional application of U.S. patent application Ser. No. 14/596,886, filed on Jan. 14, 2015, the content of which is incorporated herein by reference in its entirety.

BACKGROUND OF THE INVENTION

Field of the Invention

The invention is related to the Configurable Non-Volatile Content Addressable Memory (CNVCAM). In particular, the memory of the invention can be configured to store non-volatile content data and searched by input content data. Conventionally, the memory data stored in volatile and non-volatile random access memory are only accessed by address codes with the prior knowledge of their storage locations. Arrays of CNVCAM devices of the invention can be configured to form the basic information processing units similar to a genetically configured neuron layer for processing information in the biological nervous system, where the content of information is extracted from a broadcasting field of information signals and the perceptive information from the neuron layer is generated and propagated into its next connecting neuron layers as the feed-forward signal processing.

Description of the Related Art

In the modern Von-Neumann computing architecture as shown in FIG. 1, the Central Process Unit (CPU) 10 obtains the instructions and data from the main memory units 11 by the address pointers. The CPU 10 includes a main memory 11, an arithmetic and logic unit 12, input/output equipment 13 and a program control unit 14. Prior to the computation process, CPU 10 points to the address codes of the initial instruction and data in the main memory 11 for execution. The digital data are then sequentially processed with clock steps from the arithmetic and logic unit 12 in CPU 10 according to the instructions and data accessed by the address pointer for the main memory 11. The consumed power for completing a computing process is given by $P \sim f C V_{DD}^2$, where f is the clock frequency, C is the total circuit capacitance, and $V_{DD}$ is the positive voltage supply for digital circuitry. Accordingly, the energy required for running a computation process sequence is proportional to the numbers of clock steps to complete the whole instructions, the times of accessing the main memory 11, and charging/discharging the total capacitances of the active circuitries. The more instruction steps and memory data accessing times to complete the computation process, the more energy and time are consumed for digital circuitries. For example, a digital content search operation in a memory requires multiple data transmission and comparison steps between the arithmetic and logic unit 12 and the main memory 11. The consumed energy and searching time for searching a content data in a large memory database become very inefficient as the general practice of running programmed software with multiple times of memory data accessing and data comparison in the present Von-Neumann computing system.

In order to improve the search operation efficiency, Content Addressable Memory (CAM) has been applied in computing systems for speedy operations such as internet packet routing or tagging computing instructions and parameters in cache memory. For a typical CAM operation, a digital content is broadcasted into the memory unit with pre-stored multiple memory contents. If the broadcasted digital content is matched with the digital content stored in the memory unit, a matched signal is generated. The whole searching operation is completed within one single clock step. The matched signal can be then further applied for switching on a data channel pathway for the next stage of data processing or initiating an instruction to execute a set of instructions in the computing systems.

SRAM (Static Random Access Memory) are mostly applied for the memory content storage in the conventional CAM cells. FIGS. 2A and 2B show the schematics for a typical 10T (10 Transistors) SRAM-based CAM memory unit cell for the NOR-type match line array and a typical 9T (9 Transistors) SRAM-based CAM unit cell for the NAND-type match line array, respectively. The crossed invertors of the SRAM stores a digital bit "0" with voltage potentials $V_{SS}$ at the node connected to bitline (BL) and $V_{DD}$ at the complementary node connected to the complementary bitline ($\overline{BL}$), and a digital bit "1" with the reversed voltage potentials $V_{DD}$ and $V_{SS}$ at the same nodes, respectively. The voltage potentials for the search line (SL) and the complementary search line ($\overline{SL}$) are applied with $V_{DD}$ and $V_{SS}$ for a search digital bit "1", and $V_{SS}$ and $V_{DD}$ for a search digital bit "0", respectively. For the NOR-type CAM array cell of FIG. 2A, an input digital bit to match the bit stored in the content memory cell, i. e., "1" matching "1" and "0" matching "0", the transistors M1 and M3 and the transistors M2 and M4 for the matched bit cannot be simultaneously turned on to conduct the match line (ML) to the ground. For a row of matched NOR-type CAM cells connected to form a single match line (ML), the potential of the match line can never be pulled down to the ground. Any one of not-matched bits for the row of CAM cells will result in connecting the match line to the ground.

For the NAND-type CAM array cell of FIG. 2B, if an input digital bit matches the bit stored in the content cell, either M2 or M3 in the CAM cell is turned on to pass $V_{DD}$ to the gate of M1. The voltage potential, $(V_{DD}-V_{th})$, where $V_{th}$ is threshold voltage of M2 and M3, at the gate of M1 is enough to turn M1 on to connect the left portion of the match line with the right portion of the match line together. The broken match lines connected through multiple M1s of the row between CAM cells form a single conducting match line by turning all M1s "on" for the matched bits in the row of the NAND-type match line CAM array. Any one of not-matched bits will result in an electrically broken match line (ML) for the row.

Although SRAM-based CAM is very efficient in power and speed for memory content search operation in CPU, the cost for SRAM-based CAM has been limiting the applications of large memory arrays due to their large cell sizes (9T for NOR-type and 10T for NAND-type) to occupy much of the silicon areas in Integrated Circuit (IC). The high cost leads to the applications of smaller CAM memory densities in the kilo-byte range for tagging L1 and L2 cache memory in CPU. Therefore a smaller CAM cell size with fewer device components is very desirable for the more high density CAM applications.

In another aspect of CAM applications in computing system, configurable non-volatile CAM cells can provide memory configurability and non-volatility. That is, the configurability and non-volatility of CAM can provide an algorithm for self-adaptively configuring the computing pathways learned from the previous recorded history and storing the non-volatile content and pathway data without the power requirement for keeping the memory data.

To fulfill the objectives, we apply a pair of complementary non-volatile memory devices and one MOSFET (Metal Oxide Semiconductor Field Effect Transistor) to form a basic CAM cell. A digital content bit can be configured in the complementary pair of the non-volatile devices, where each non-volatile memory device of the complementary pair can electrically connect its two device terminals by setting to the "conducting state" and electrically disconnect from its two device terminals by setting to the "non-conducting state". The non-volatile CAM cells can be configured to form a NOR-type match line array and an NAND-type match line array, respectively. A string of input digital content data (a byte, a word, or a sentence) signals can be simultaneously broadcasted into the configured non-volatile CAM array for a digital content match. The matched signals can be then applied for triggering the sequential data processing, instruction execution, and both.

SUMMARY OF THE INVENTION

The configurable non-volatile CAM cell 300 consists of two complementary non-volatile memory devices 310 and 320, and an N-type MOSFET (NMOSFET) device 330 as shown in FIG. 3. One terminal of each of the two non-volatile memory devices 310 and 320 are connected together to form the output node 315 of the complementary non-volatile memory pair. The other two terminals 311 and 321 of the complementary non-volatile memory pair form the input nodes 311 and 321, respectively. The output node 315 is connected to the gate electrode 331 of the NMOSFET device 330 with the source node 332 and drain electrode 333. For the NMOSFET NOR-type match line CAM array (n-bit×m-row) 40 as shown in FIG. 4, the multiple NMOSFET devices 330 for each row of CAM cells 300 are connected in cell pairs 400 such that each pair 400 has a common source electrode 332 and two drain electrodes 333 connected to the match line for the paired NMOSFET devices 400 of the row. For the NMOSFET NAND-type match line CAM array 60 (n-bit×m-row) as shown in FIG. 6, the multiple NMOSFET devices 330 for each row of CAM cells 300 are connected in series to form a match line for the row.

The complementary pair of non-volatile memory devices 310 and 320 can be programmed such that one is in the "conducting state" and the other is in the "non-conducting state". For example, as illustrated in the top row of FIG. 5 for the NMOSFEET NOR-type match-line non-volatile CAM array 40, the complementary non-volatile memory devices 310 and 320 connected to B and $\bar{B}$ are programmed to the "non-conducting state" and "conducting state" for configuring non-volatile data "1", and to the "conducting state" and "non-conducting state" for configuring non-volatile data "0", respectively. The complementary non-volatile devices are both programmed to the "non-conducting state" to have a floating output node M for a "don't care" bit.

For an input digital datum "1" as illustrated in the middle row of FIG. 5, $V_{DD}$ and $V_{SS}$ are applied to B and $\bar{B}$ for the search operation. While for an input digital datum "0" as illustrated in the bottom row of FIG. 5, $V_{SS}$ and $V_{DD}$ are applied to B and $\bar{B}$ for the search operation. When the input digital data match a row of non-volatile CAM cells, the voltage potential $V_{SS}$ from every output nodes of the complementary non-volatile memory pairs is to turn off all the NMOSFET devices 330 in the row of the matched CAM cells as illustrated for the row j in FIG. 4. Consequently the match line ML (j) for the row of the matched CAM cells in FIG. 4 is completely electrically disconnected from the CSL lines attached to the ground potential. Any one of not-matched bits in the row results in $V_{DD}$ at the output nodes 315 of the not-matched CAM cells to turn on NMOSFET 330 devices in the row to electrically connect the match line to one of the CSL lines. The voltage potential at the NMOSFET NOR-type match line for the not-matched row can be pulled down to ground potential through any one of the not-matched bits electrically connected to the CSL lines. For the case of "don't care" bit, the floating voltage potential at the output node of the complementary non-volatile memory devices cannot turn on the NMOSFET device 330 in the CAM cell to electrically connect the match line to its connecting CSL line, and can be considered to be a "matched" for the "don't care" bit.

For the NMOSFET NAND-type match line non-volatile CAM array as illustrated in the top row of FIG. 7, the non-volatile memory devices 310 and 320 connected to B and $\bar{B}$ are programmed to the "conducting state" and the "non-conducting state" for configuring non-volatile data "1", and to the "non-conducting state" and the "conducting state" for configuring non-volatile data "1", respectively.

For an input digital datum "1" as illustrated in the middle row of FIG. 7, $V_{DD}$ and $V_{SS}$ are applied to B and $\bar{B}$ for the search operation. While for an input digital datum "0" as illustrated in the bottom row of FIG. 7, $V_{SS}$ and $V_{DD}$ are applied to B and $\bar{B}$ for the search operation. When the input digital data match a row of non-volatile CAM cells, the voltage potential $V_{DD}$ from every output nodes of the complementary non-volatile memory pairs is able to turn on all the NMOSFET devices 330 as illustrated for the row j of the matched CAM cells in FIG. 6. Consequently the match line ML (j) for the row of the matched CAM cells is electrically connected from its right node 611 to its left node 610 to form a single conducting match line. Any one of not-matched bits in the row will result in a broken conducting match line for the voltage potential $V_{SS}$ at the output nodes 315 of the complementary pairs to turn off the NMOSFET devices 330 in the not-matched CAM cells. Thus the broken conducting match line for the row of not-matched CAM cells is not electrically connected to form a conducting match line from the right node to the left node of the series-connected NMOSFET NAND-string.

For the "don't care" bit operation in NAND match line CAM array 60, the output potential at the output node M/315 for the "don't care" bit of the CAM cell is required to be $V_{DD}$ for considering a "matched" bit of the NAND match line for the row. The operation for outputting $V_{DD}$ at the node M/315 can be done by applying voltage bias $V_{DD}$ to both B and $\bar{B}$ of the CAM cells for the "don't care" bit without the forbidden configuration of "non-conducting state" for both NVM devices in a search operation.

The configurable non-volatile CAM cell 800 consists of two complementary non-volatile memory devices 810 and 820, and a P-type MOSFET (PMOSFET) device 830 as shown in FIG. 8. One terminal of each non-volatile memory device is connected together to form the output node 815 of the complementary non-volatile memory pair. The other two terminals of the complementary non-volatile memory pair form the input nodes 811 and 821, respectively. The output node 815 is connected to the gate electrode 831 of the PMOSFET device 830 with the source node 832 and drain electrode 833 in an N-type well. For the PMOSFET NOR-type match line CAM array (n-bit×m-row) 90 as shown in FIG. 9, the multiple PMOSFET devices 830 for each row of CAM cells 800 are connected in cell pairs 900 such that each pair 900 has a common source electrode 832 and two drain electrodes 833 connected to the match line for the paired PMOSFET devices 830 in the row. For the PMOSFET NAND-type match-line CAM array 110 (n-bit×m-row) as shown in FIG. 11, the multiple PMOSFET 830 devices for each row of CAM cells are connected in series to form a match line for the row.

The complementary pair of non-volatile memory devices 810 and 820 can be programmed so that one is in the "conducting state" and the other is in the "non-conducting state". For example, as illustrated in the top row of FIG. 10 for the PMOSFET NOR-type match line non-volatile CAM array 90, the non-volatile memory devices 810 and 820 connected to B and $\overline{B}$ are programmed to the "conducting state" and "non-conducting state" for configuring non-volatile data "1", and to the "non-conducting state" and "conducting state" for configuring non-volatile data "0", respectively. The complementary non-volatile memory devices are both programmed to the "non-conducting state" to have a floating output node M for a "don't care" bit.

For an input digital datum "1" as illustrated in the middle row of FIG. 10, $V_{DD}$ and $V_{SS}$ are applied to B and $\overline{B}$ for the search operation. While for an input digital datum "0" as illustrated in the bottom row of FIG. 10, $V_{SS}$ and $V_{DD}$ are applied to B and $\overline{B}$ for the search operation. When the input digital data match a row of non-volatile CAM cells, the voltage potential $V_{DD}$ for every output nodes 815 of the complementary non-volatile memory pairs is to turn off all the PMOSFET devices 830 in the row of the matched CAM cells as illustrated for the row j in FIG. 9. Consequently the match line ML (j) for the row of the matched CAM cells in FIG. 9 is completely electrically disconnected from the CSL lines biased with the positive rail voltage potential $V_{DD}$. Any one of not-matched bits in the row results in $V_{SS}$ at the output nodes 815 of the not-matched CAM cells to turn on the PMOSFET devices 830 in the row to connect the match line to one of the CSL lines. The voltage potential at the PMOSFET NOR-type match line for the not-matched row is then charged to $V_{DD}$ through one of the not-matched bits connected to the CSL lines. For the case of "don't care" bit, the floating voltage potential at the output node 815 of the complementary non-volatile memory devices cannot turn on the PMOSFET device 830 in the CAM cell to electrically connect the match line to its connecting CSL line, and can be considered to be a "matched" for the "don't care" bit.

For the PMOSFET NAND-type match line non-volatile CAM array 110 as illustrated in the top row of FIG. 12, the non-volatile memory devices 810 and 820 connected to B and $\overline{B}$ are programmed to the "non-conducting state" and the "conducting state" for configuring non-volatile data "1", and to the "conducting state" and the "non-conducting state" for configuring non-volatile data "1", respectively.

For an input digital datum "1" as illustrated in the middle row of FIG. 12, $V_{DD}$ and $V_{SS}$ are applied to B and $\overline{B}$ for the search operation. While for an input digital datum "0" as illustrated in the bottom row of FIG. 12, $V_{SS}$ and $V_{DD}$ are applied to B and $\overline{B}$ for the search operation. When the input digital data match a row of non-volatile CAM cells the voltage potential $V_{SS}$ from every output nodes of the complementary non-volatile memory pairs, is able to turn on all the PMOSFET devices 830 as illustrated for the row j of the matched CAM cells in FIG. 11. Consequently the match line ML (j) for the row of the matched CAM cells is electrically connected from its right node 1111 to its left node 1110 to form a single conducting match line. Any one of not-matched bits in the row will result in a broken conducting match line with the voltage potential $V_{DD}$ at the output nodes 815 of the complementary pair to turn off the PMOSFET devices 330 for the not-matched CAM cells. Thus the broken conducting match line for the row of not-matched CAM cells is not electrically connected to form a single conducting match line from the right node 1111 to the left node 1110 of the series-connected PMOSFET NAND-string.

For the "don't care" bit operation in PMOSFET NAND match line CAM array 110, the output potential at the output node M/815 for the "don't care" bit of the CAM cell is required to be $V_{SS}$ for considering a "matched" bit of the PMOSFET NAND match line for the row. The operation for outputting $V_{SS}$ at the node M/815 can be done by applying voltage bias $V_{SS}$ to both B and $\overline{B}$ of the CAM cells for the "don't care" bit without the forbidden configuration of "non-conducting state" for both NVM devices in a search operation.

BRIEF DESCRIPTION OF THE DRAWINGS

For a better understanding of the present invention and to show how it may be carried into effect, reference will now be made to the following drawings, which show the preferred embodiment of the present invention, in which:

FIG. 5 illustrates the definition of configured non-volatile data (top) and the search operation for input datum "1" (middle) and input datum "0" (bottom) for the NMOSFET NOR-type match line array.

FIG. 12 illustrates the definition of configured non-volatile data (top) and the search operation for input datum "1" (middle) and input datum "0" (bottom) for the PMOSFET NAND-type match line array.

DETAILED DESCRIPTION OF THE INVENTION

The following detailed description is meant to be illustrative only and not limiting. It is to be understood that other embodiment may be utilized and element changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 13:
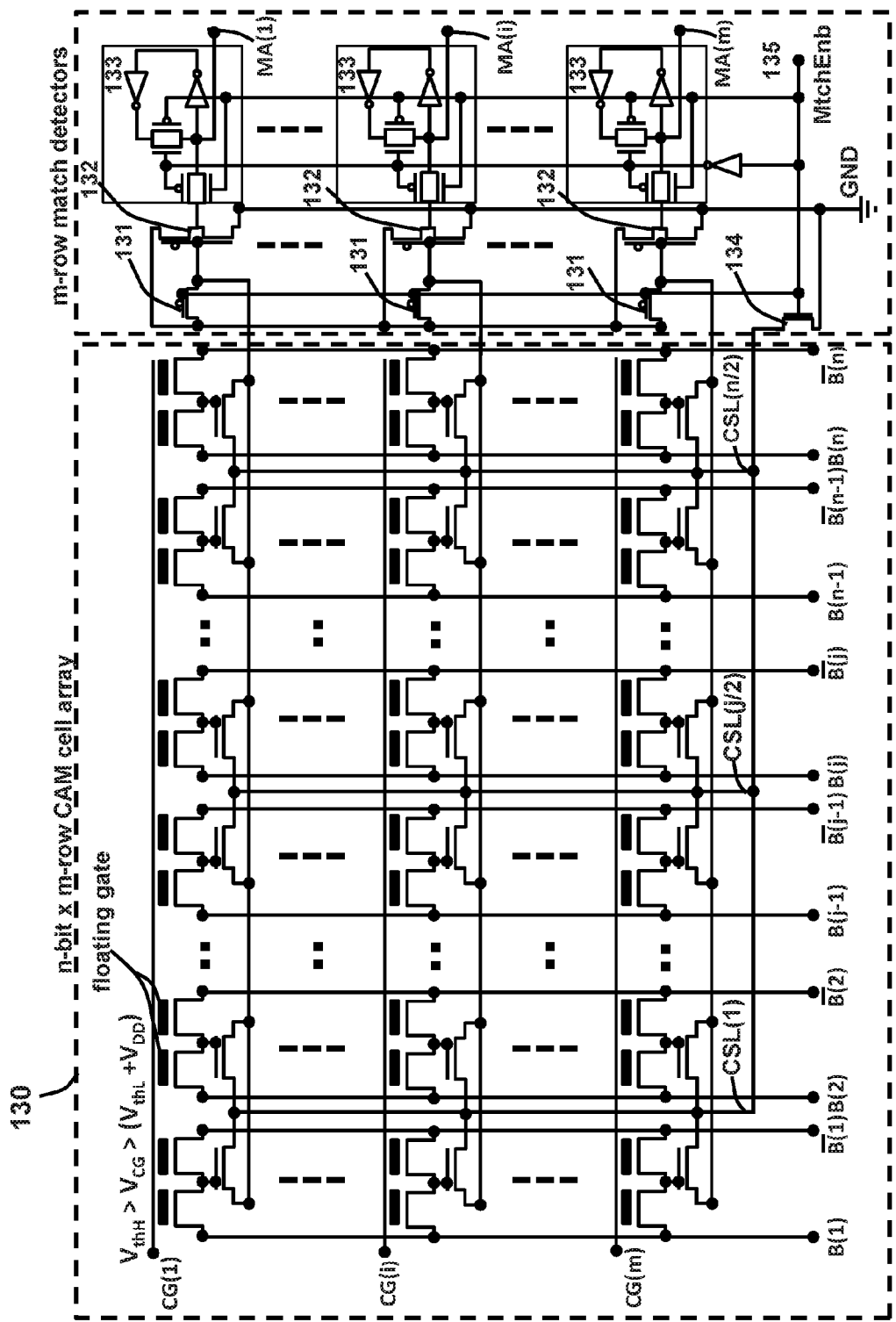
FIG. 13 shows the schematic of one embodiment for NMOSFET NOR match line CNVCAM array using a unit cell consisting of a complementary pair of floating gate non-volatile memory devices and one NMOSFET.

FIG. 13 shows the schematic of an n-bit×m-row NMOSFET NOR-type match-line CAM array 130 with m-row match detectors. The non-volatile memory devices for the complementary pairs in the CAM array 130 are the floating gate MOSFET non-volatile memory devices. The floating gate non-volatile memory devices can be programmed to high threshold voltage state denoted by $V_{thH}$, by Fowler-Nordheim (F/N) tunneling method or by the secondary hot electron injection method described in the U.S. patent application Ser. No. 13/920,886 (the disclosure of which is incorporated herein by reference in their entirety) without suffering the notorious non-volatile memory device punch-through issue. It is well known in the art that the floating gate non-volatile memory devices can be erased to a low threshold voltage state denoted by $V_{thL}$, by the tunneling method for removing electrons out of the floating gate. As disclosed in U.S. Pat. No. 8,817,546 B2 (the disclosure of which is incorporated herein by reference in their entirety), the complementary pair of the floating gate non-volatile memory devices can be programmed so that one is in the high threshold voltage state $V_{thH}$ and the other remains in the low threshold voltage state $V_{thL}$. When the voltage biases $V_{CG}$, with $V_{thH}>V_{CG}>(V_{thL}+V_{DD})$, and $V_{DD}$ and $V_{SS}$ are applied to the control gate for turning one NVM device "on" and the other NVM device "off" and the input nodes of the complementary pair respectively, the digital voltage signal ($V_{DD}$ or $V_{SS}$) is directly passed to the output node of the complementary pair without requiring a sensing amplifier for the digital signal conversion.

Figure 5:
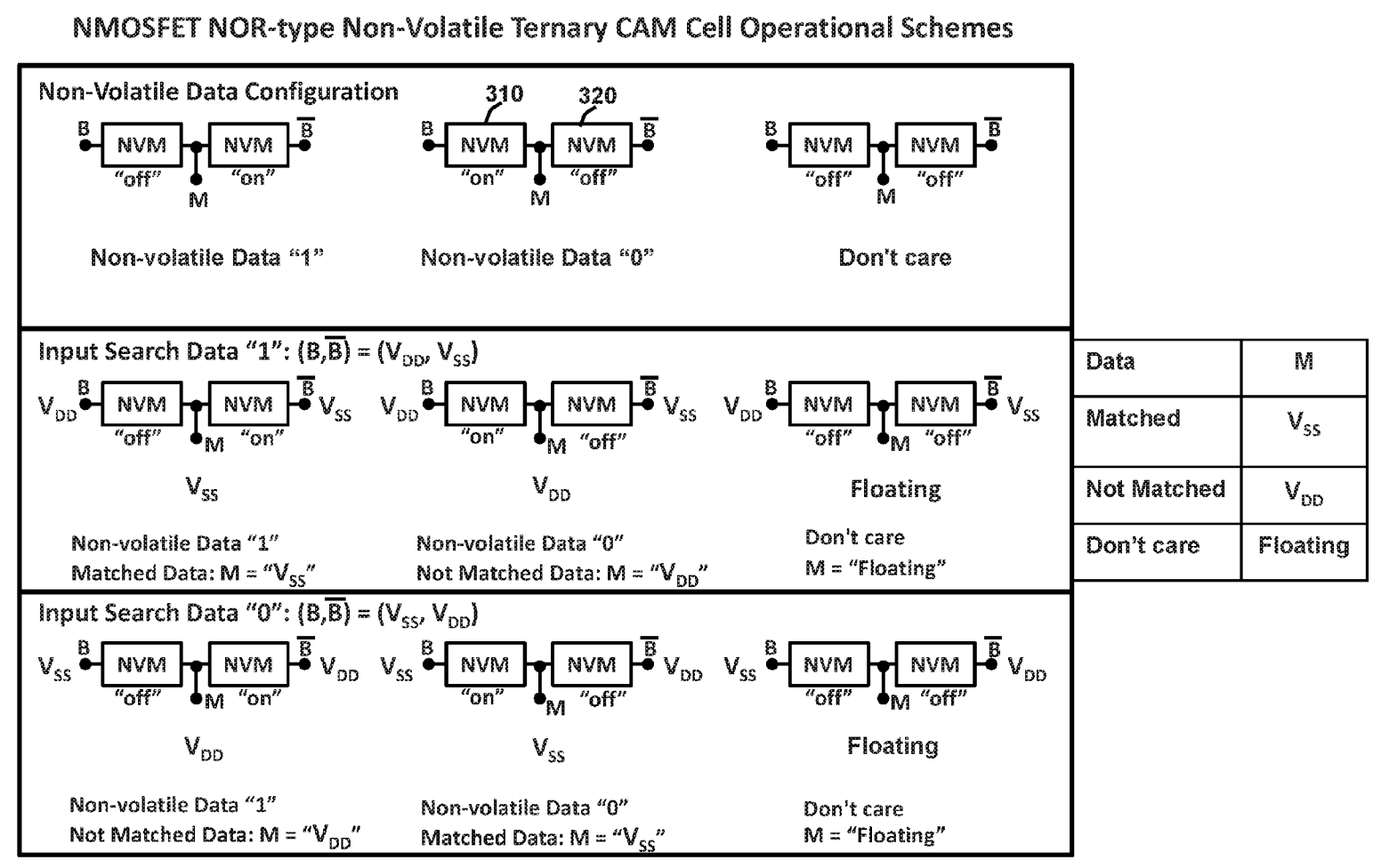

To configure the non-volatile CAM cell, we initially erase the complementary non-volatile memory devices to the low threshold voltage state $V_{thL}$. Then the secondary hot electron method disclosed in the U.S. patent application Ser. No. 13/920,886 has been applied to configure the non-volatile complementary pairs by applying voltage bias $V_{DD}$ (~3 V) and floating to the drain electrodes (B and $\bar{B}$) for the programming devices and the not-programming devices respectively with an applied high voltage pulse (amplitude>$V_{DD}$) to the control gates (CG) of the row of non-volatile memory devices as shown in FIG. 13. The non-volatile data in the array 130 of FIG. 13 are configured according to the configuration definition in the top row of FIG. 5. That is, the non-volatile memory devices of the complementary pair connected to B and $\bar{B}$ are programmed to the "high threshold voltage state $V_{thL}$" and remained in "the low threshold voltage state $V_{thL}$" for configuring non-volatile data "1", and remained in the "low threshold voltage state $V_{thL}$" and programmed to the "high threshold voltage state $V_{thH}$" for configuring non-volatile data "0", respectively. The complementary non-volatile memory devices are both programmed to the "high threshold voltage state $V_{thH}$" to have a floating node at the NMOSFET gate for a "don't care" bit.

After non-volatile data configuration in the array 130, the search operation is done by applying $V_{DD}$ and $V_{SS}$ for input datum "1" and $V_{SS}$ and $V_{DD}$ for datum "0" to B and $\bar{B}$, respectively. The positive voltage $V_{DD}$ for the logic core voltage rail is between 0.9V to 1.2V such that the read disturbance of the floating gate non-volatile devices does not occur for passing $V_{DD}$. The core logic voltage signals $V_{DD}$ and $V_{SS}$ are applied to turn "on" and "off" the NMOSFET core devices in the CAM cells respectively. For searching a digital content to match the configured non-volatile digital content, a string of input digital signals containing multiple "0"s and "1"s are applied to multiple B (1:n) and $\bar{B}$ (1:n) according to their digital values shown in FIG. 13. When not-matched bits occur in a row of CAM cells, $V_{DD}$ is passed to turn on the NMOSFET devices in the not-matched CAM cells to electrically connect its match line to the multiple CSL (1:n/2) lines shown in FIG. 13. For a full digital content match or partial match with "don't care" bits, the non-volatile complementary pairs pass $V_{SS}$ to turn "off" the entire NMOSFET devices in their matched CAM cells in the row. The match line for the matched row is fully electrically disconnected from the multiple CSL lines.

The match line for each row is connected to a match detector consisting of a PMOSFET device 131 for charging the match line to $V_{DD}$, an inverter 132 for sensing the match line voltage potential, and a data flip-flop 133 to catch the matching data from the left portion of match detectors in FIG. 13. When the match enable signal at the node 135 (MtchEnb) is not activated by $V_{SS}$ for its default digital value "0", the match detectors for all the rows in the array 130 are disabled and all the PMOSET devices 131 in the array 130 are "on" for charging and retaining the match line voltage potential to $V_{DD}$. When the match enable signal (MtchEnb) is turned to $V_{DD}$ for a search operation, the NMOSFET device 134 is turned on to connect the CSL lines to ground potential. The PMOSFET devices 131 are off during the search operation to prevent any DC current paths for the match detectors through the match-lines. The voltage potentials at the match lines for not-matched rows discharge from $V_{DD}$ to $V_{SS}$ through CSL lines and NMOSFET devices 134 for the search operation. The not-matched signal $V_{DD}$ through the inverter 132 from the not-matched rows is captured in the data flip-flop 133. Accordingly the signal captured in the data flip-flop 133 is $V_{DD}$ for the not-matched rows during the search operation. For a matched row, the voltage potential of its match line remains at $V_{DD}$ with no electrically discharging path to the ground. The signals captured in the data flip-flop 133 are $V_{SS}$ for a matched row and $V_{DD}$ for "not-matched" rows respectively for the search operation. The digital data signal $V_{SS}$ captured in the data flip-flop 133 from the input digital content matched with a configured non-volatile digital content can be applied to switching on a data pathway or triggering to execute a set of computing instructions.

Figure 14:
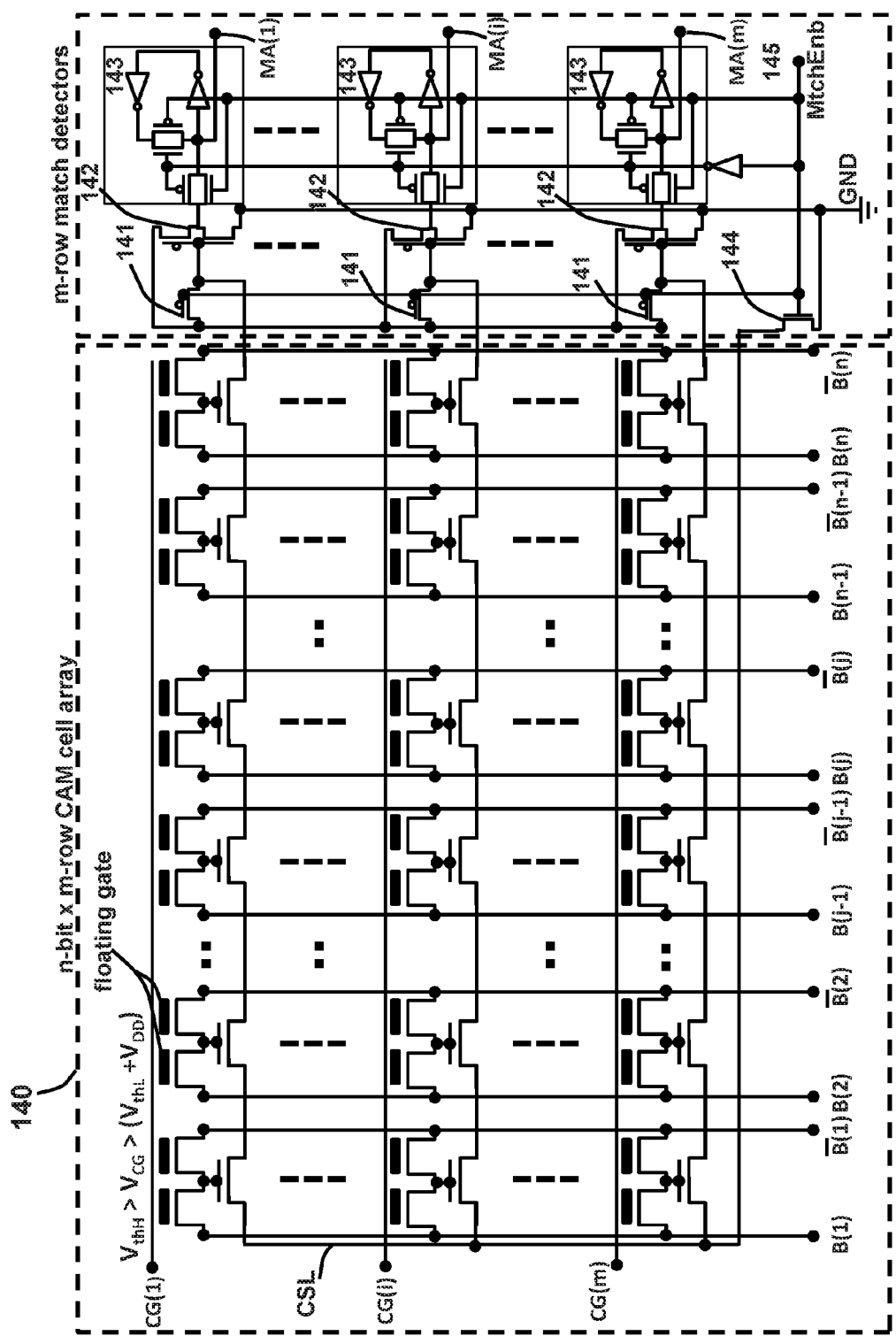
FIG. 14 shows the schematic of another embodiment for NMOSFET NAND match line CNVCAM array using a unit cell consisting of a complementary pair of floating gate non-volatile memory devices and one NMOSFET.

FIG. 14 shows the schematic of an n-bit×m-row NMOS-FET NAND-type match line CAM array 140 with m-row match detectors. The non-volatile memory devices for the complementary pairs in the CAM array 140 are the floating gate MOSFET non-volatile memory devices. The floating gate non-volatile memory devices can be programmed to high threshold voltage state denoted by $V_{thH}$, by Fowler-Nordheim (F/N) tunneling method or by the secondary hot electron injection method described in the U.S. patent application Ser. No. 13/920,886 without suffering the notorious non-volatile memory device punch-through issue. The floating gate non-volatile memory devices can be erased to a low threshold voltage state denoted by $V_{thL}$, by the tunneling method for removing electrons out of the floating gate. As disclosed in U.S. Pat. No. 8,817,546 B2, the complementary pair of the floating gate non-volatile memory devices can be programmed so that one is in the high threshold voltage state $V_{thH}$ and the other is in the low threshold voltage state $V_{thL}$. When the voltage biases $V_{CG}$, with $V_{thH} > V_{CG} > (V_{thL}, V_{DD})$, and $V_{DD}$ and $V_{SS}$ are applied to the control gate for turning one NVM device "on" and the other NVM device "off" and the input nodes of the complementary pair respectively, the digital voltage signal ($V_{DD}$ or $V_{SS}$) is directly passed to the output node of the complementary pair without requiring a sensing amplifier for the digital signal conversion.

Figure 1:
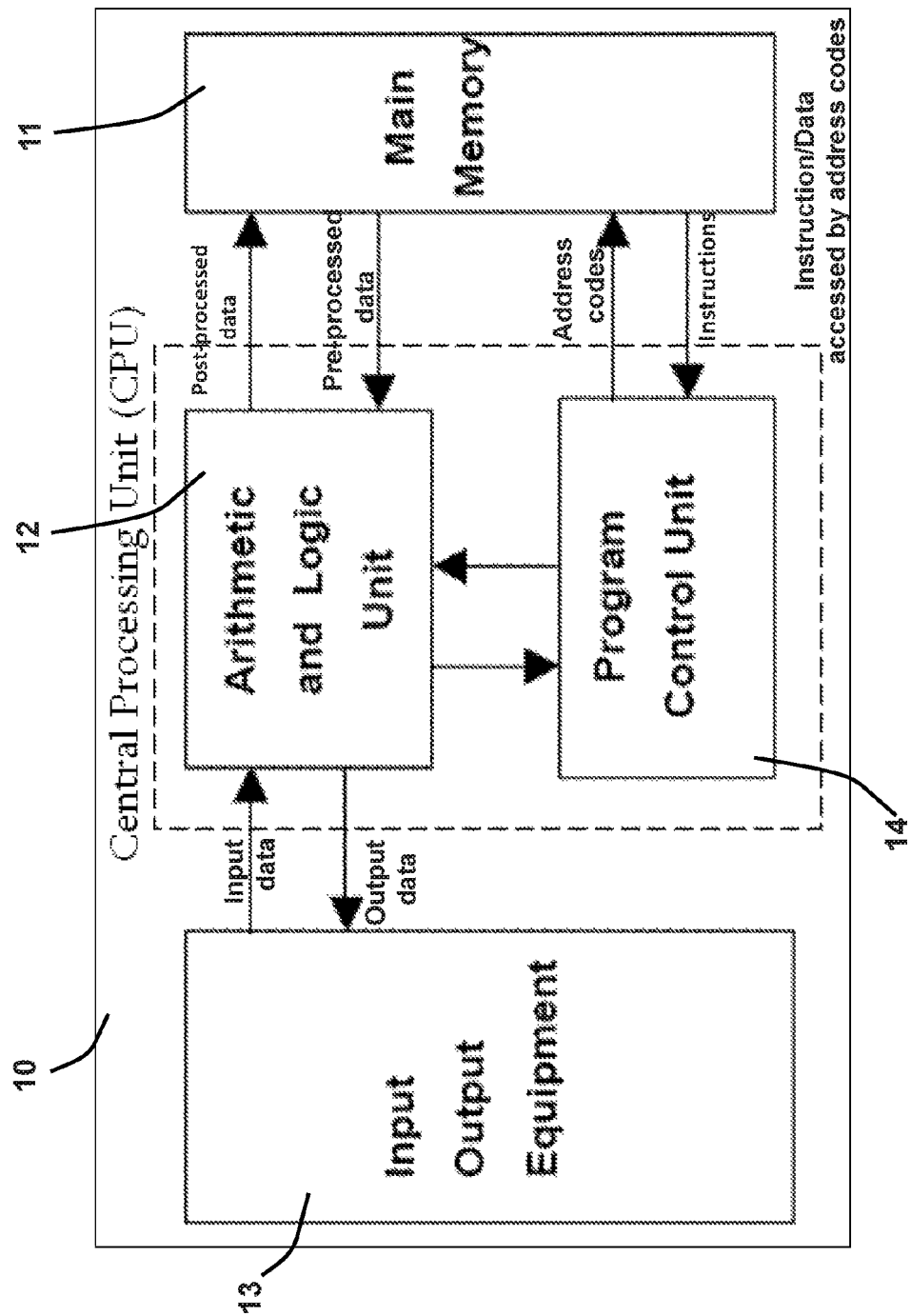
FIG. 1 shows the conventional Von-Neumann computing architecture for a typical Central Processing Unit (CPU).
Figure 2B:
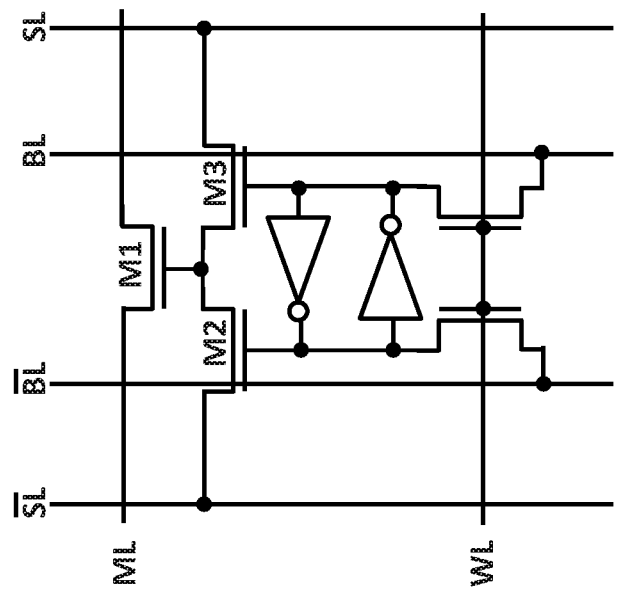
FIG. 2B shows the conventional SRAM-based CAM array cells for NAND-type match line.
Figure 2A:
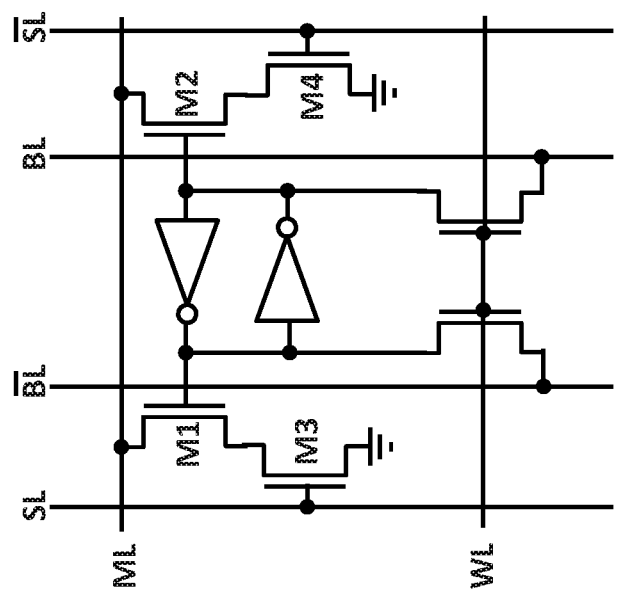
FIG. 2A shows the conventional SRAM-based CAM array cells for NOR-type match line.
Figure 3:
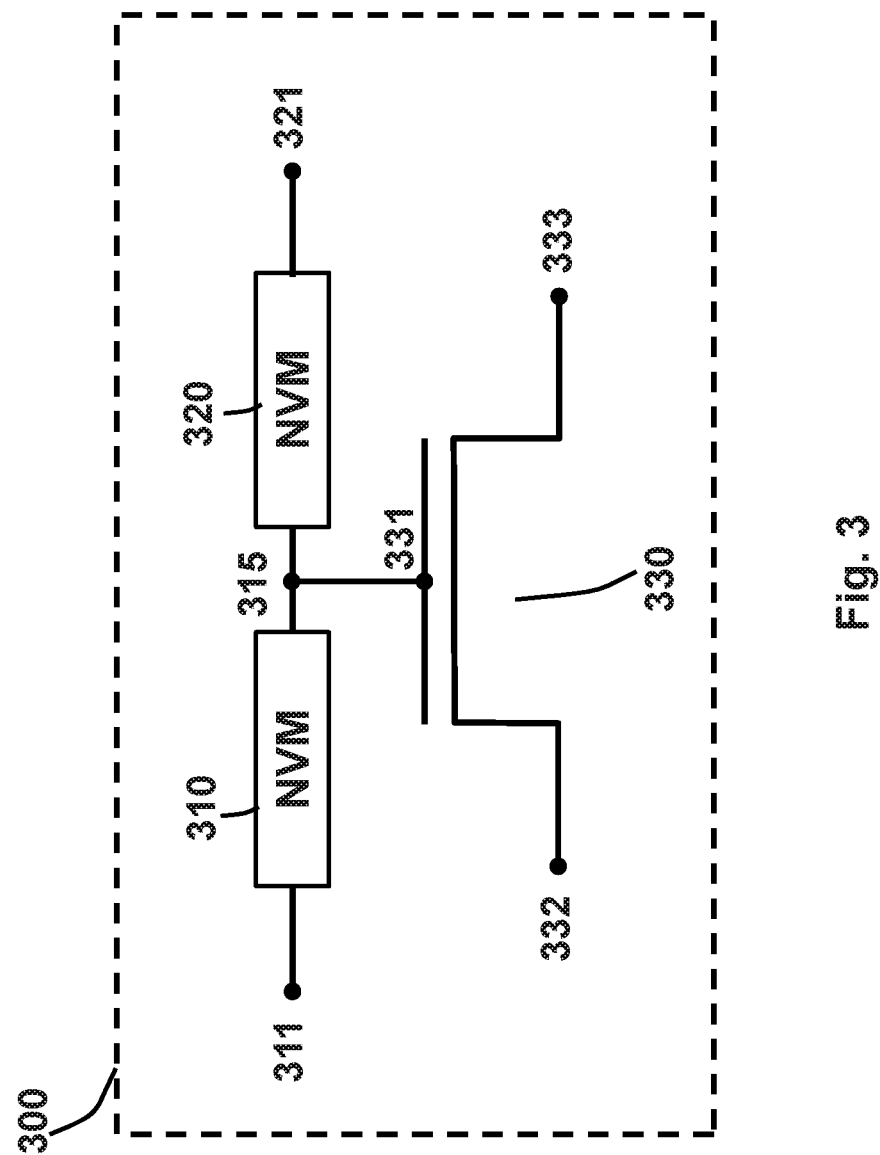
FIG. 3 shows a Configurable Non-Volatile Content Addressable Memory (CNVCAM) cell consisting of a complementary pair of non-volatile memory devices and one N-type MOSFET according to an embodiment of the invention.
Figure 4:
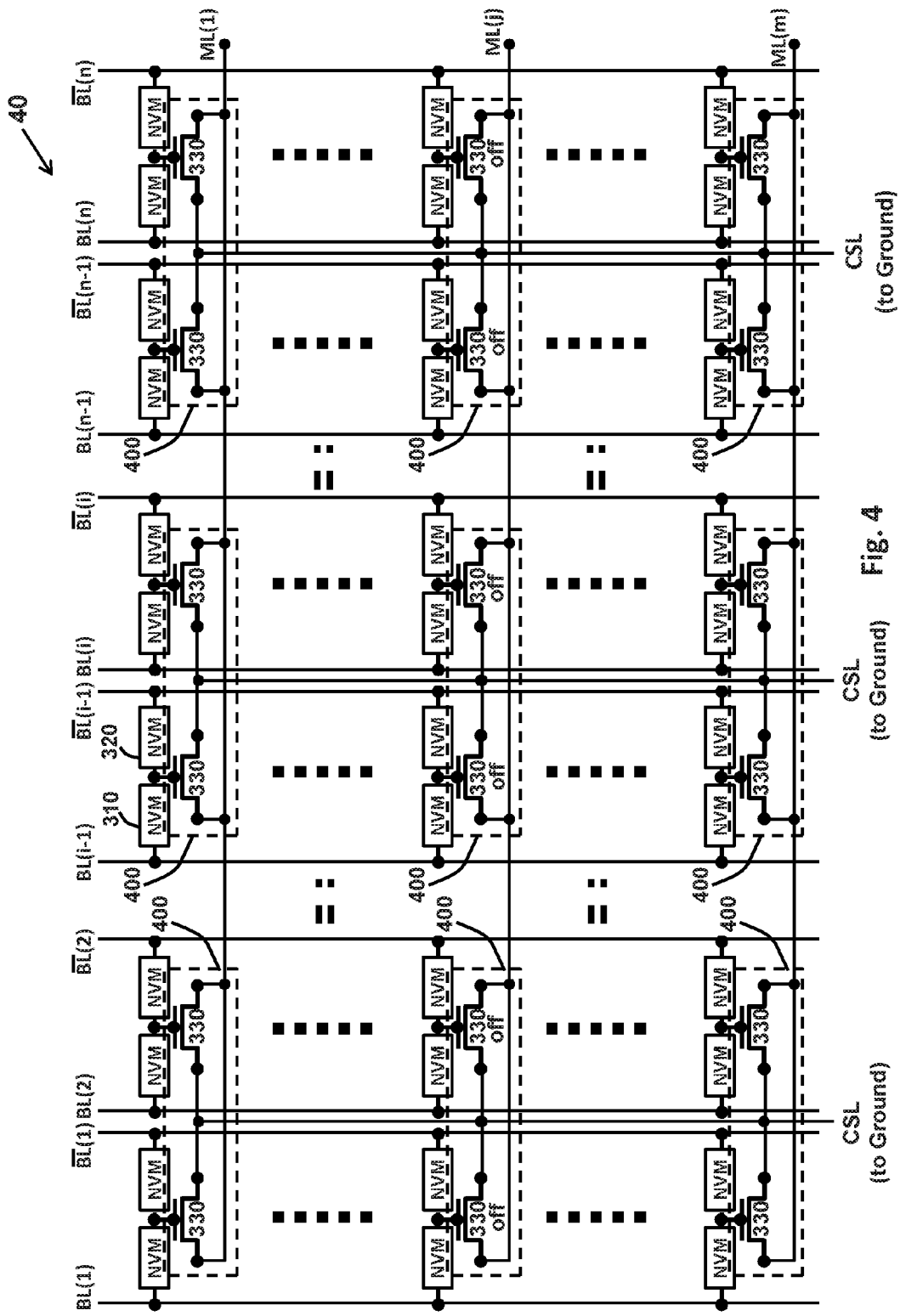
FIG. 4 shows an n-bit×m-row NMOSFET NOR-type match line array using the CNVCAM cell in FIG. 3.
Figure 6:
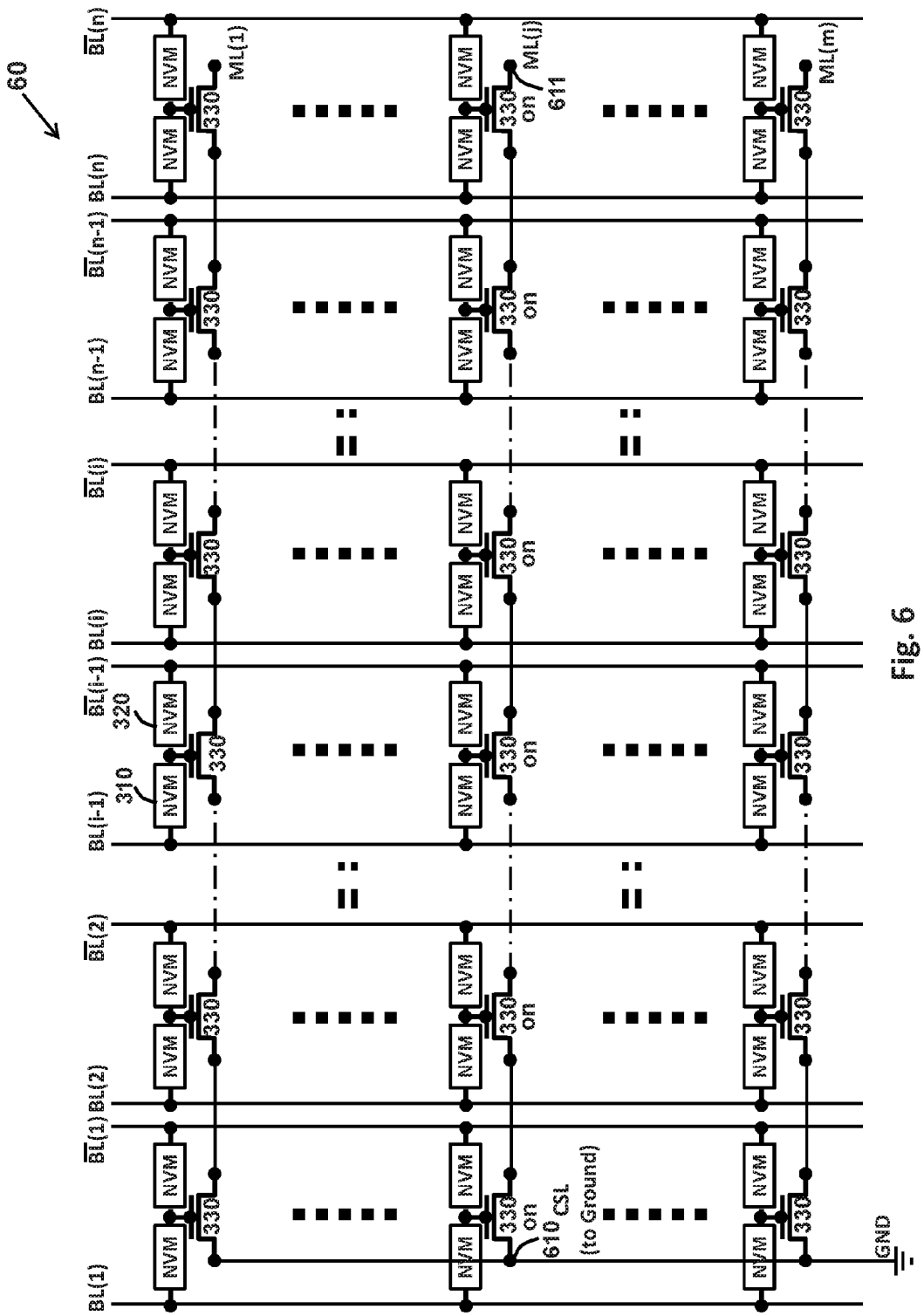
FIG. 6 shows an n-bit×m-row NMOSFET NAND-type match line array using the CNVCAM cell in FIG. 3.
Figure 7:
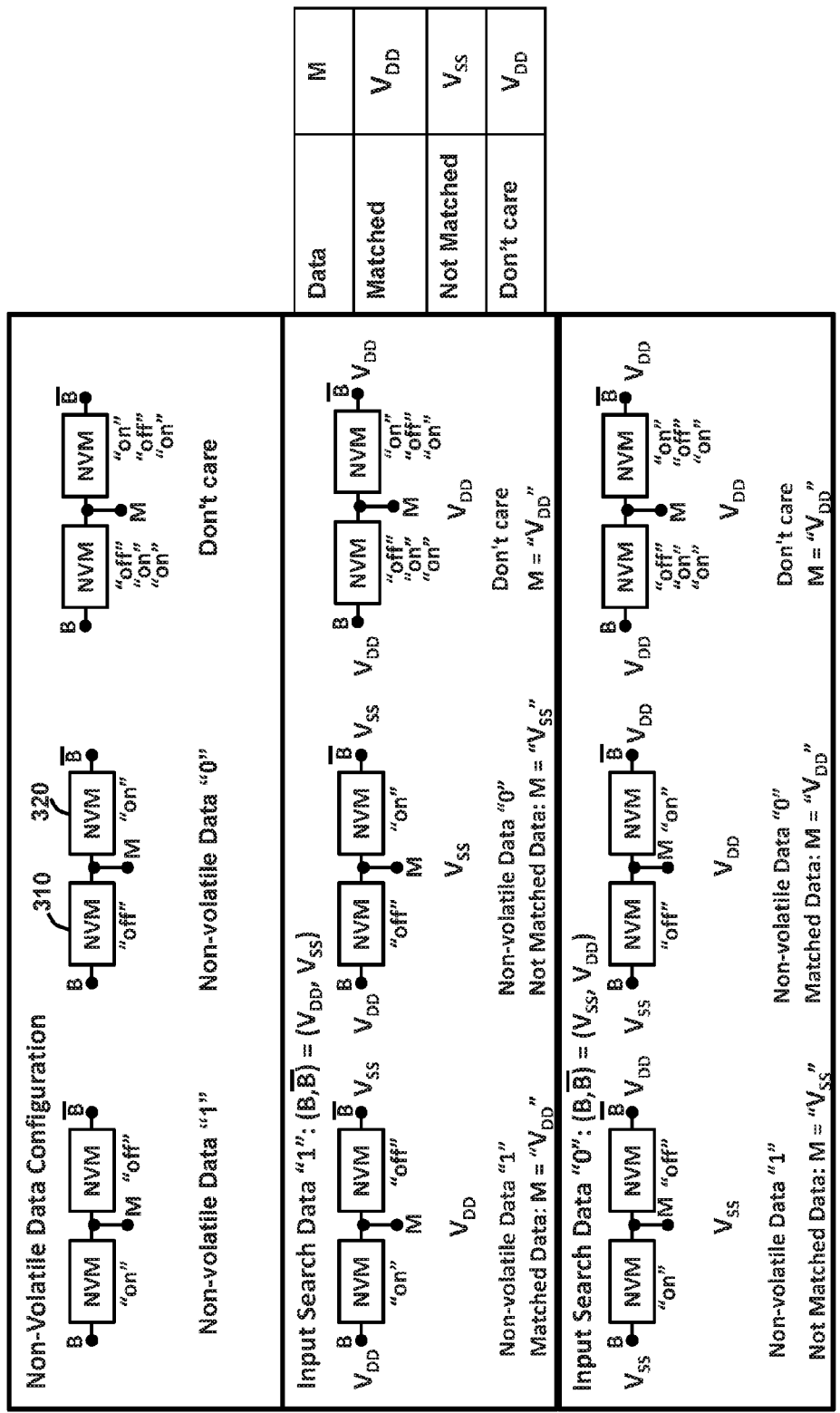
FIG. 7 illustrates the definition of configured non-volatile data (top) and the search operation for input datum "1" (middle) and input datum "0" (bottom) for the NMOSFET NAND-type match line array.
Figure 8:
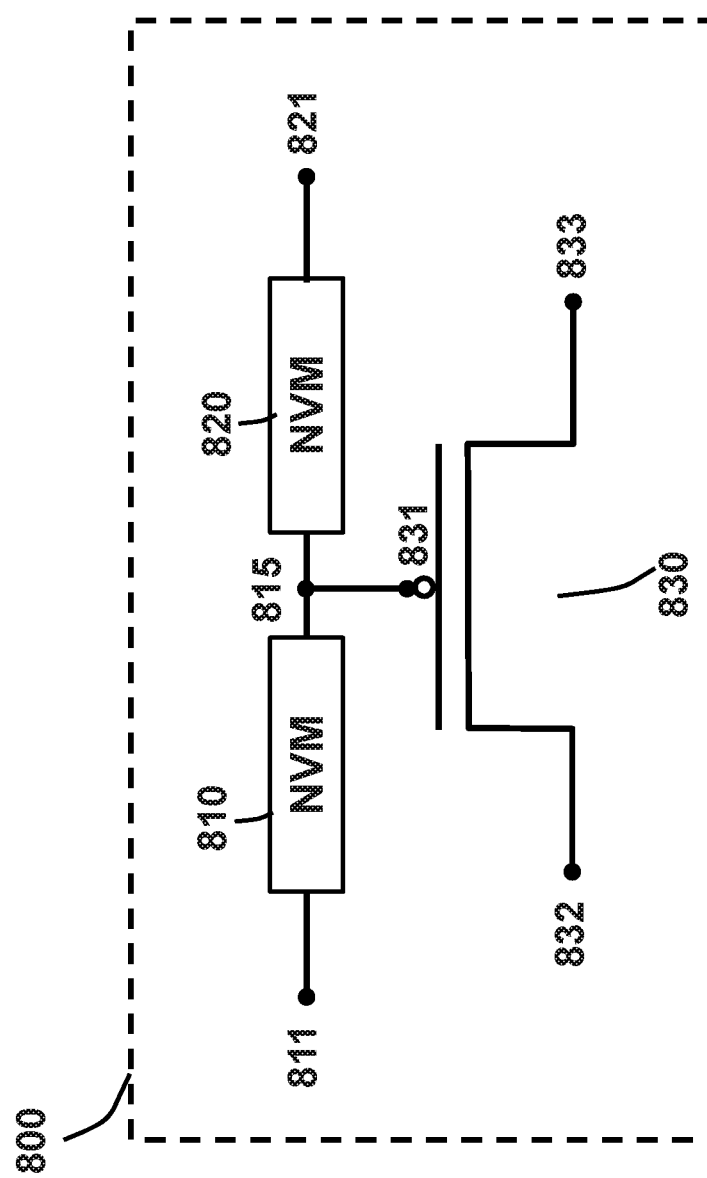
FIG. 8 shows a Configurable Non-Volatile Content Addressable Memory (CNVCAM) cell consisting of a complementary pair of non-volatile memory devices and one P-type MOSFET according to another embodiment of the invention.
Figure 9:
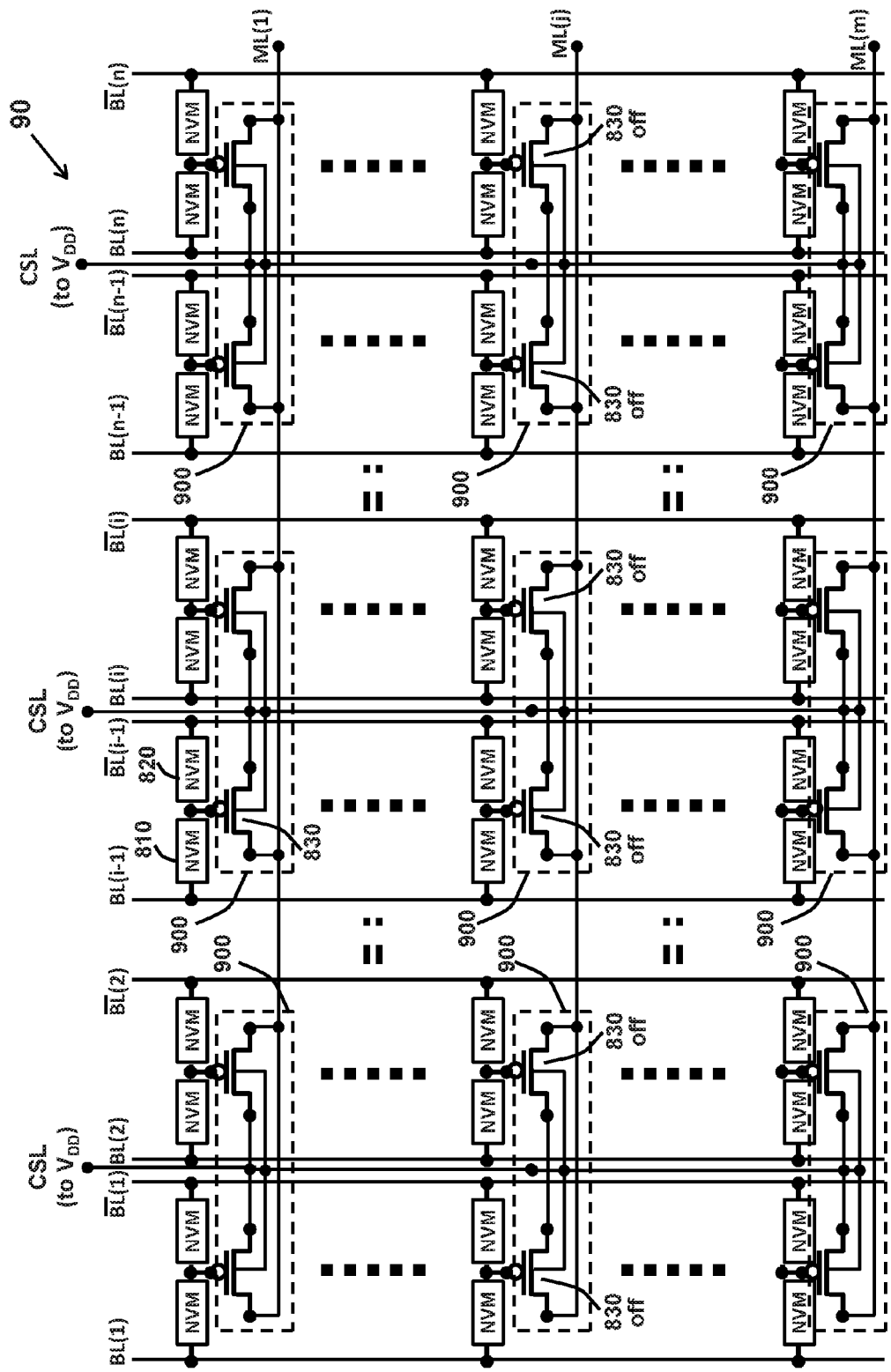
FIG. 9 shows an n-bit×m-row PMOSFET NOR-type match line array using the CNVCAM cell in FIG. 8.

To configure the non-volatile CAM cell, the complementary non-volatile memory devices are initially erased to the low threshold voltage state $V_{thL}$. Then the secondary hot electron method disclosed in U.S. patent application Ser. No. 13/920,886 has been applied to configure the non-volatile complementary pairs by applying voltage bias $V_{DD}$ (~3 V) and floating to the drain electrodes (B and $\overline{B}$) for the programming devices and the not-programming devices respectively with an applied high voltage pulse (amplitude>$V_{DD}$) to the control gates (CG) of the row of non-volatile memory devices as shown in FIG. 14. The non-volatile data in the array 140 of FIG. 14 are configured according to the configuration definition in the top row of FIG. 7. That is, the non-volatile memory devices of the complementary pair connected to B and $\overline{B}$ are remained in the "low threshold voltage state $V_{thL}$" and programmed to "the high threshold voltage state $V_{thH}$" for configuring non-volatile data "1", and programmed to the "high threshold voltage state $V_{thH}$" and remained in the "low threshold voltage state $V_{thL}$" for configuring non-volatile data "0", respectively.

After non-volatile data configuration in the array 140, the search operation is done by applying $V_{DD}$ and $V_{SS}$ for input datum "1" and $V_{SS}$ and $V_{DD}$ for datum "0" to B and $\overline{B}$, respectively. $V_{DD}$ is also applied to both B and g for the "don't care" bits without the forbidden configuration of "non-conducting state" for both NVM devices. The positive voltage $V_{DD}$ for the logic core voltage rail is between 0.9V to 1.2V such that the read disturbance of the floating gate non-volatile devices does not occur for passing $V_{DD}$. The core logic voltage signals $V_{DD}$ and $V_{SS}$ are applied to turn "on" and "off" the NMOSFET core devices in the CAM cells respectively. For searching a digital content to match the configured non-volatile digital content, a string of input digital signals containing multiple "0"s and "1"s are applied to multiple B (1:n) and (1:n) according to their digital values shown in FIG. 14. When not-matched bits occur in a row of CAM cells, $V_{SS}$ at the output node of the non-volatile complementary pairs is passed to turn off the NMOSFET devices for the not-matched CAM cells to electrically break up the match lines for the rows shown in FIG. 14. For a full digital content match or partial match with "don't care" bits, the non-volatile complementary pairs pass $V_{DD}$ to turn "on" the entire NMOSFET devices. The match line in the matched row is electrically connected.

The match line for each row is connected to a match detector consisting of a PMOSFET device 141 for charging the match line to $V_{DD}$, an inverter 142 for sensing the match line voltage potential, and a data flip-flop 143 to catch the matching data from the left portion of match detectors in FIG. 14. When the match enable signal at the node 145 (MtchEnb) is not activated by $V_{SS}$ for its default digital value "0", the match detectors for all the rows in the array 140 are disabled and all the PMOSET devices 141 in the array 140 are "on" for charging and retaining the match line voltage potential to $V_{DD}$. When the MtchEnb node 145 is turned to $V_{DD}$ during a search operation, the NMOSFET device 144 is turned on to electrically connect the Common Source Line (CSL) for vertically connecting the left nodes of the match lines to the ground potential shown in FIG. 14. The PMOSFET devices 141 are off during the search operation to prevent any DC current paths for the match detectors through the match lines. The voltage potentials at the match lines for not-matched rows remain at $V_{DD}$ to form the electrically broken match lines. The not-matched signal $V_{DD}$ through the inverter 142 from the not-matched rows is captured in the data flip-flop 143. Note that to prevent a significant $V_{DD}$ drop from charge sharing of the match detector and the partial match line for a false matched reading, the match detector capacitance must be significantly larger than the match line capacitance. The signal captured in the data flip-flop 143 is then $V_{SS}$ for the not-matched rows during the search operation. For a matched row of fully electrically connected match line, the voltage potential at the match line and detector input node discharges from $V_{DD}$ to ground. The signal captured in the data flip-flop 143 is $V_{DD}$ for the matched row for the search operation. The digital data signals captured in the data flip-flop 143 can be applied to switching on a data pathway or triggering to execute a set of computing instructions for the input digital content matched with a configured non-volatile digital content.

Figure 15:
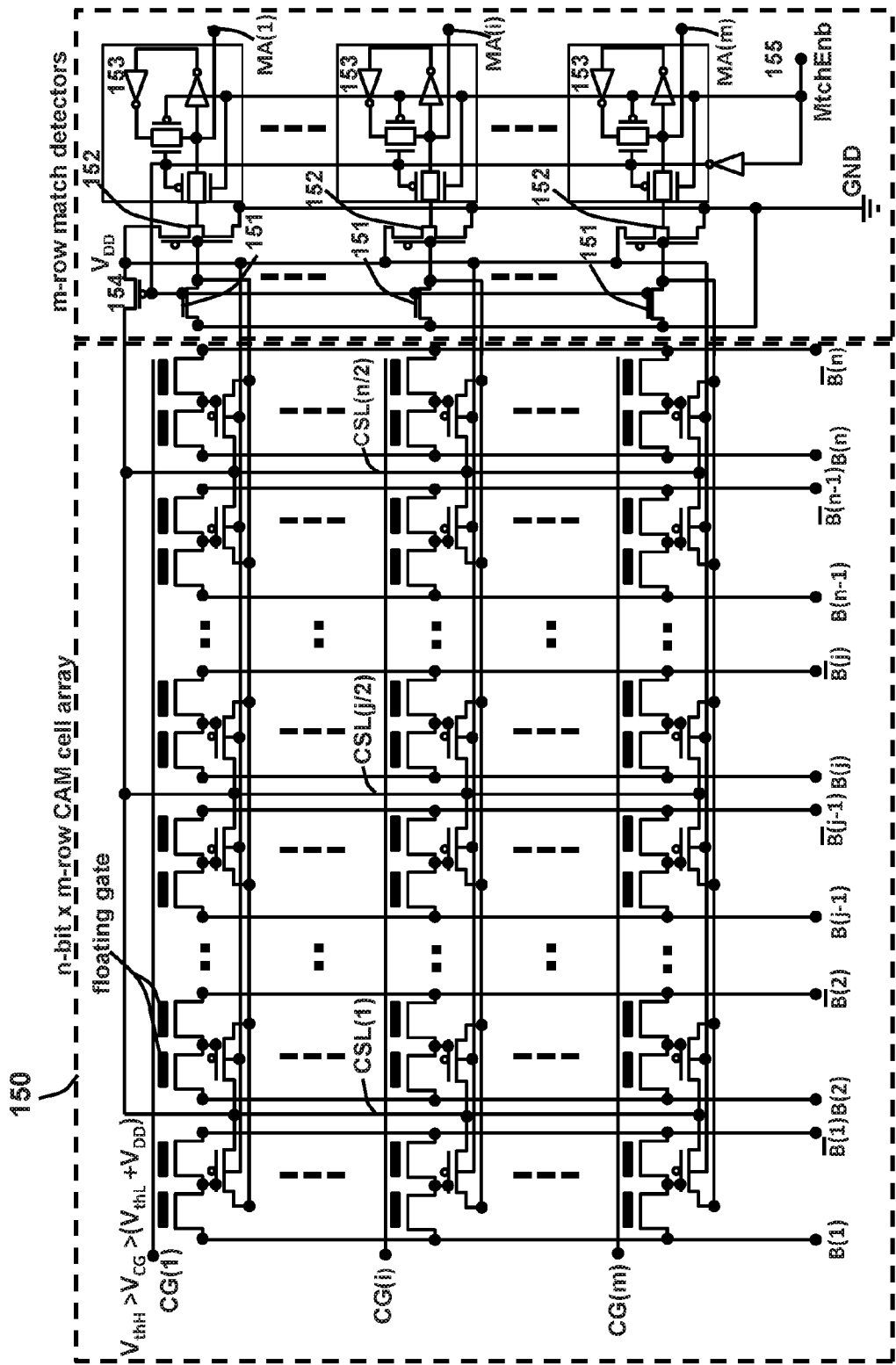
FIG. 15 shows the schematic of one embodiment for PMOSFET NOR match-line CNVCAM array using a unit cell consisting of a complementary pair of floating gate non-volatile memory devices and one PMOSFET.

FIG. 15 shows the schematic of an n-bit×m-row PMOSFET NOR-type match-line CAM array 150 with m-row match detectors. The non-volatile memory devices for the complementary pairs in the CAM array 150 are the floating gate MOSFET non-volatile memory devices. The floating gate non-volatile memory devices can be programmed to high threshold voltage state denoted by $V_{thH}$, by Fowler-Nordheim (F/N) tunneling method or by the secondary hot electron injection method described in the U.S. patent application Ser. No. 13/920,886 without suffering the notorious non-volatile memory device punch-through issue. It is well known in the art that the floating gate non-volatile memory devices can be erased to a low threshold voltage state denoted by $V_{thL}$, by the tunneling method for removing electrons out of the floating gate. As disclosed in U.S. Pat. No. 8,817,546 B2, the complementary pair of the floating gate non-volatile memory devices can be programmed so that one is in the high threshold voltage state $V_{thH}$ and the other remains in the low threshold voltage state $V_{thL}$. When the voltage biases $V_{CG}$, with $V_{thH} > V_{CG} > (V_{thL} + V_{DD})$, and $V_{DD}$ and $V_{SS}$ are applied to the control gate for turning one NVM device "on" and the other NVM device "off" and the input nodes of the complementary pair respectively, the digital voltage signal ($V_{DD}$ or $V_{SS}$) is directly passed to the output node of the complementary pair without requiring a sensing amplifier for the digital signal conversion.

Figure 10:
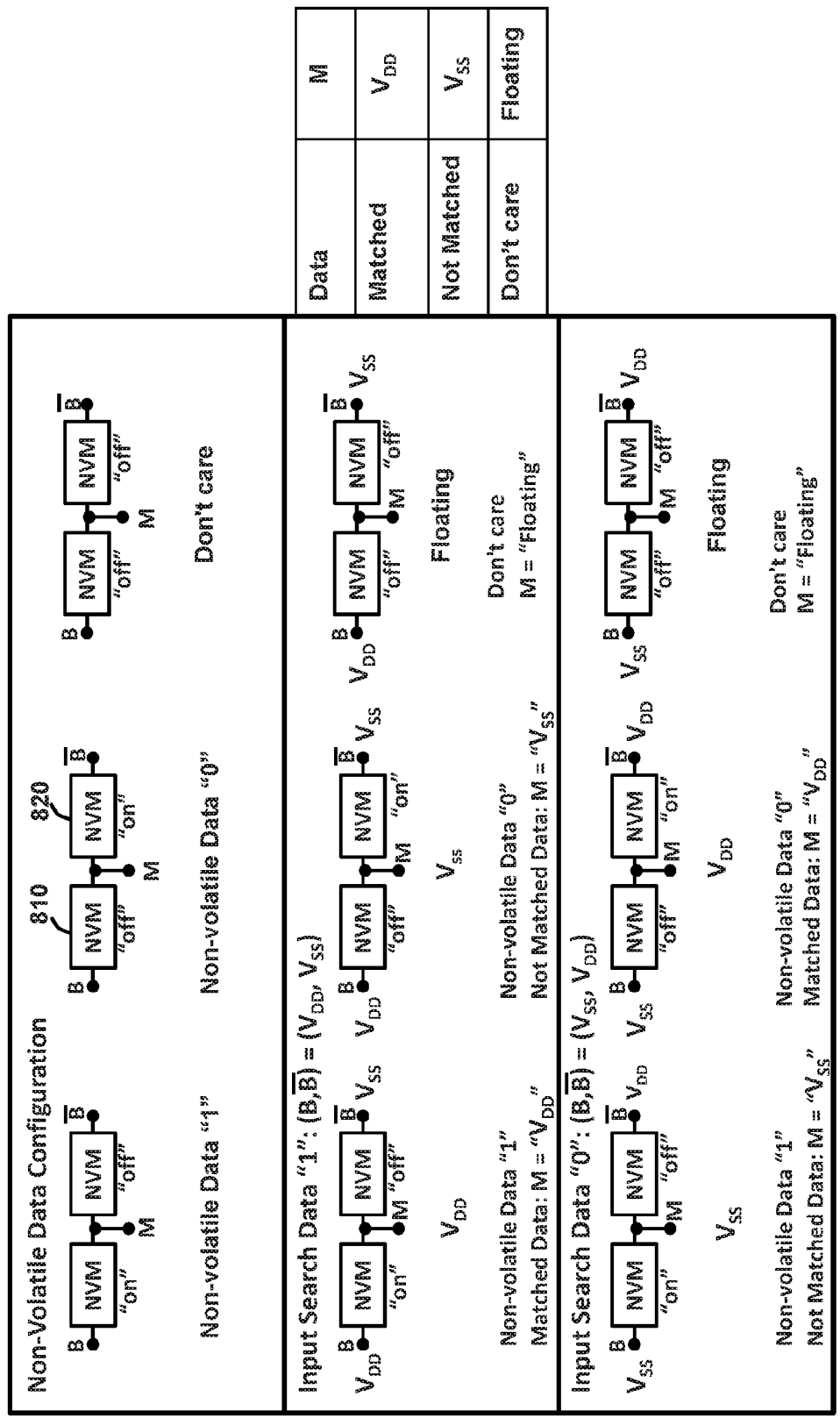
FIG. 10 illustrates the definition of configured non-volatile data (top) and the search operation for input datum "1" (middle) and input datum "0" (bottom) for the PMOSFET NOR-type match line array.
Figure 11:
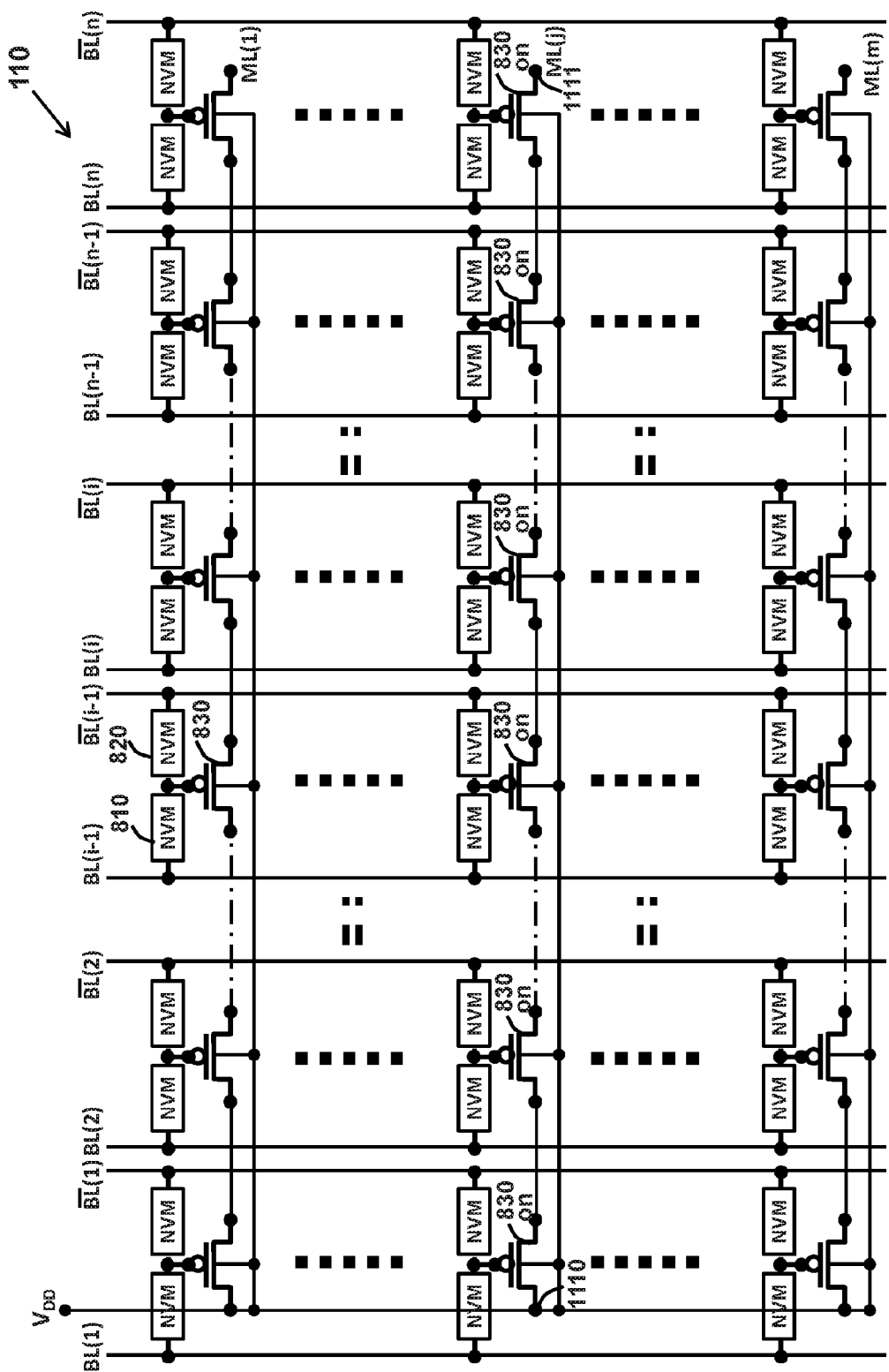
FIG. 11 shows an n-bit×m-row PMOSFET NAND-type match-line array using the CNVCAM cell in FIG. 8.

To configure the non-volatile CAM cell, we initially erase the complementary non-volatile memory devices to the low threshold voltage state $V_{thL}$. Then the secondary hot electron method disclosed in the U.S. patent application Ser. No. 13/920,886 has been applied to configure the non-volatile complementary pairs by applying voltage bias $V_{DD}$ (~3 V) and floating to the drain electrodes (B and $\overline{B}$) for the programming devices and the not-programming devices respectively with an applied high voltage pulse (amplitude>$V_{DD}$) to the control gates (CG) of the row of non-volatile memory devices as shown in FIG. 15. The non-volatile data in the array 150 of FIG. 15 are configured according to the configuration definition in the top row of FIG. 10. That is, the non-volatile memory devices of the complementary pair connected to B and $\overline{B}$ are remained in "the low threshold voltage state $V_{thL}$" and programmed to the "high threshold voltage state $V_{thH}$" for configuring non-volatile data "1", and programmed to the "high threshold voltage state $V_{thH}$" and remained in the "low threshold voltage state $V_{thL}$" for configuring non-volatile data "0", respectively. The complementary non-volatile memory devices are both programmed to the "high threshold voltage state $V_{thH}$" to have a floating node at the PMOSFET gate for a "don't care" bit.

After non-volatile data configuration in the array 150, the search operation is done by applying $V_{DD}$ and $V_{SS}$ for input datum "1", and $V_{SS}$ and $V_{DD}$ for datum "0" to B and $\overline{B}$, respectively. The positive voltage $V_{DD}$ for the logic core voltage rail is between 0.9V to 1.2V such that the read disturbance of the floating gate non-volatile devices does not occur for passing $V_{DD}$. The core logic voltage signals $V_{DD}$ and $V_{SS}$ are applied to turn "off" and "on" the PMOSFET core devices in the CAM cells respectively. For searching a digital content to match the configured non-volatile digital content, a string of input digital signals containing multiple "0"s and "1"s are applied to multiple B (1:n) and $\overline{B}$ (1:n) according to their digital values shown in FIG. 15. When not-matched bits occur in a row of CAM cells, $V_{SS}$ is passed to turn on the PMOSFET devices in the not-matched CAM cells to electrically connect its match line to the multiple CSL(1:n/2) lines shown in FIG. 15. For a full digital content match or partial match with "don't care" bits, the non-volatile complementary pairs pass $V_{DD}$ to turn "off" the entire PMOSFET in their matched CAM cells in the row. The match line for the matched row is fully electrically disconnected from the multiple CSL lines.

The match line for each row is connected to a match detector consisting of a NMOSFET device 151 for grounding the match line to $V_{SS}$, an inverter 152 for sensing the match line voltage potential, and a data flip-flop 153 to catch the matching data from the left portion of match detectors in FIG. 15. When the match enable signal at the node 155 (MtchEnb) is not activated by $V_{SS}$ for its default digital value "0", the match detectors for all the rows in the array 150 are disabled and all the NMOSET devices 151 in the array 150 are "on" for grounding the match line voltage potential to $V_{SS}$. When the match enable signal (MtchEnb) is turned to $V_{DD}$ for a search operation, the PMOSFET device 154 is turned on to connect the CSL lines to positive voltage potential $V_{DD}$. The NMOSFET devices 151 are "off" to disconnect from ground potential during the search operation to prevent any DC current paths for the match detectors through the match lines. The voltage potentials at the match-lines for not-matched rows charge from $V_{SS}$ to $V_{DD}$ through the CSL lines and PMOSFET 154 device for the search operation. The not-matched signal $V_{SS}$ through the inverter 152 from the not-matched rows is captured in the data flip-flop 153. Accordingly the signal captured in the data flip-flop 153 is $V_{SS}$ for the not-matched rows for the search operation. For a matched row, the voltage potential at its match line remains at $V_{SS}$ without any charging path to $V_{DD}$. The signals captured in the data flip-flop 153 are $V_{DD}$ for a matched row and $V_{SS}$ for "not-matched" rows respectively for the search operation. The digital data signal $V_{DD}$ captured in the data flip-flop from the input digital content matched with a configured non-volatile digital content can be applied to switching on a data pathway or triggering to execute a set of computing instructions.

Figure 16:
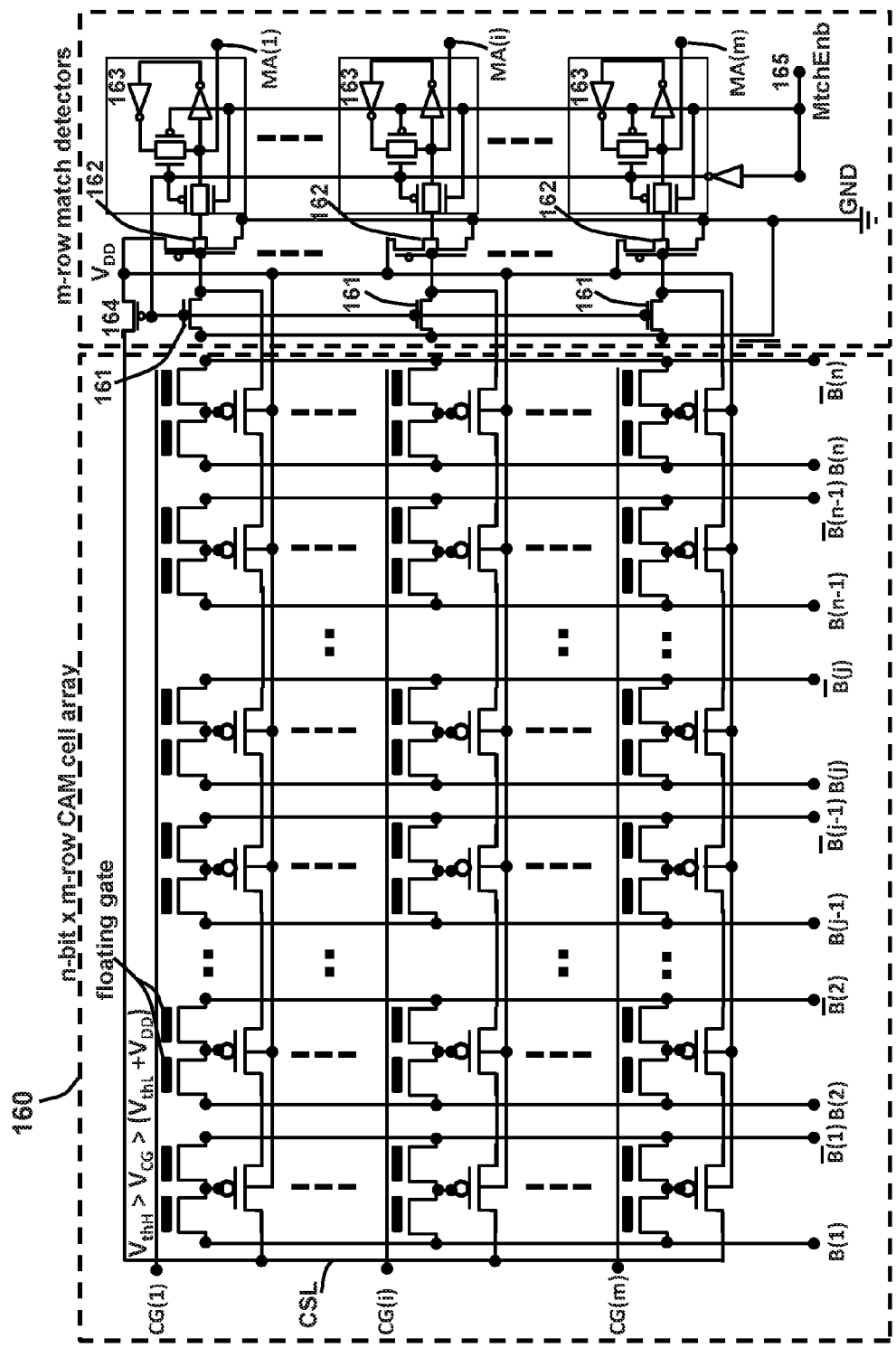
FIG. 16 shows the schematic of another embodiment for PMOSFET NAND match-line CNVCAM array using a unit cell consisting of a complementary pair of floating gate non-volatile memory devices and one PMOSFET.

FIG. 16 shows the schematic of an n-bit×m-row NMOSFET NAND-type match-line CAM array 160 with m-row match detectors. The non-volatile memory devices for the complementary pairs in the CAM array 160 are the floating gate MOSFET non-volatile memory devices. The floating gate non-volatile memory devices can be programmed to high threshold voltage state denoted by $V_{thH}$, by Fowler-Nordheim (F/N) tunneling method or by the secondary hot electron injection method described in the U.S. patent application Ser. No. 13/920,886 without suffering the notorious non-volatile memory device punch-through issue. The floating gate non-volatile memory devices can be erased to a low threshold voltage state denoted by $V_{thL}$, by the tunneling method for removing electrons out of the floating gate. As disclosed in U.S. Pat. No. 8,817,546 B2, the complementary pair of the floating gate non-volatile memory devices can be programmed so that one is in the high threshold voltage state $V_{thH}$ and the other remains in the low threshold voltage state $V_{thL}$. When the voltage biases $V_{CG}$, with $V_{thH}$>$V_{CG}$>($V_{thL}$+$V_{DD}$), and $V_{DD}$ and $V_{SS}$ are applied to the control gate for turning one NVM device "on" and the other NVM device "off", and the input nodes of the complementary pair respectively, the digital voltage signal ($V_{DD}$ or $V_{SS}$) is directly passed to the output node of the complementary pair without requiring a sensing amplifier for the digital signal conversion.

Figure 12:
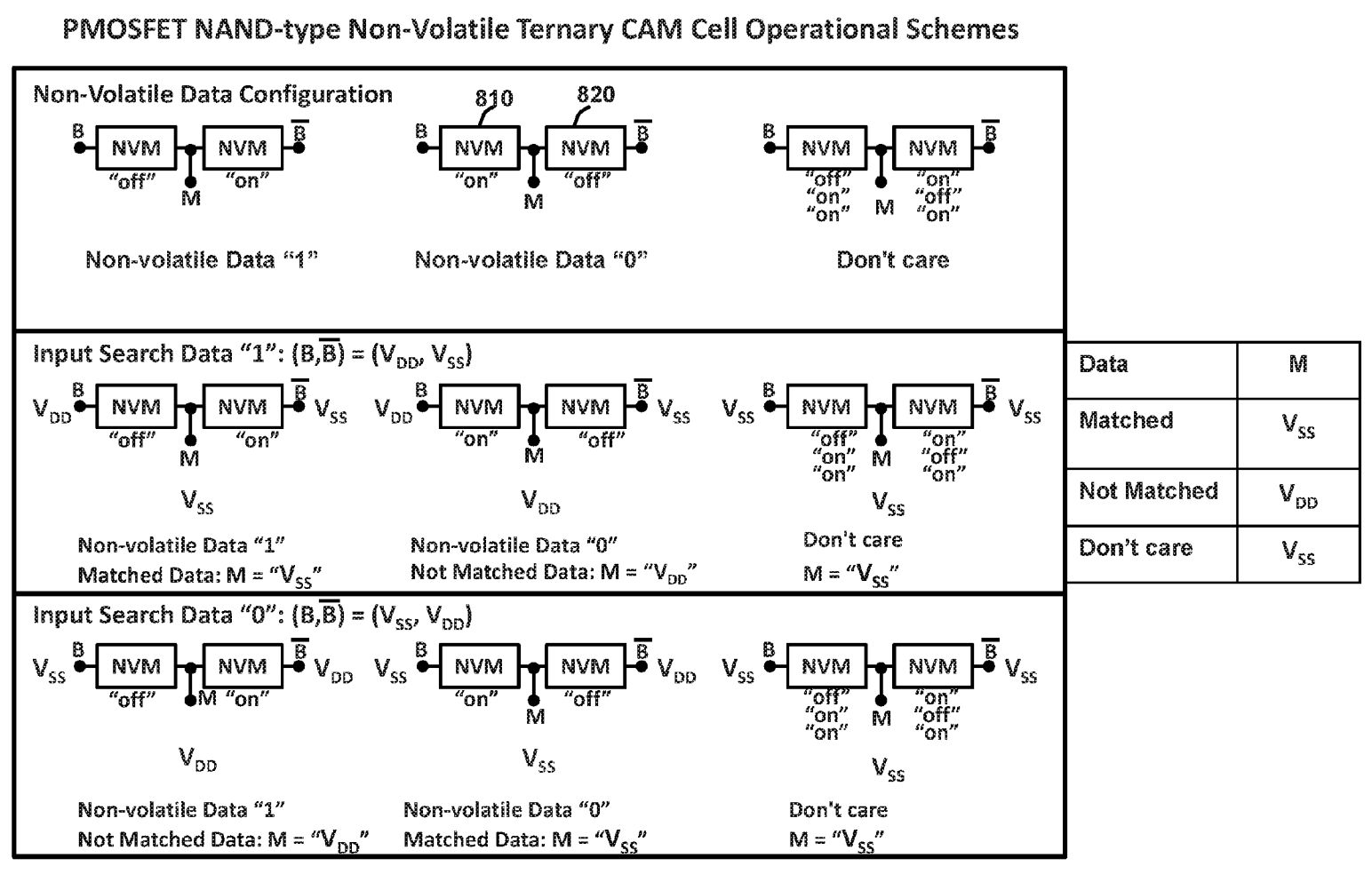

To configure the non-volatile CAM cell, the complementary non-volatile memory devices are initially erased to the low threshold voltage state $V_{thL}$. Then the secondary hot electron method disclosed in U.S. patent application Ser. No. 13/920,886 has been applied to configure the non-volatile complementary pairs by applying voltage bias $V_{DD}$ (~3 V) and floating to the drain electrodes (B and $\overline{B}$) for the programming devices and the not-programming devices respectively with an applied high voltage pulse (amplitude>$V_{DD}$) to the control gates (CG) of the row of non-volatile memory devices as shown in FIG. 16. The non-volatile data in the array 160 of FIG. 16 are configured according to the configuration definition in the top row of FIG. 12. That is, the non-volatile devices of the complementary pair connected to B and $\overline{B}$ are programmed to "the high threshold voltage state $V_{thH}$" and remained in the "low threshold voltage state $V_{thL}$" for configuring non-volatile data "1", and remained in the "low threshold voltage state $V_{thL}$" and programmed to the "high threshold voltage state $V_{thH}$" for configuring non-volatile data "0", respectively.

After non-volatile data configuration in the array 160, the search operation is done by applying $V_{DD}$ and $V_{SS}$ for input datum "1", and $V_{SS}$ and $V_{DD}$ for datum "0" to B and $\overline{B}$, respectively. $V_{SS}$ is also applied to both B and $\overline{B}$ for the "don't care" bits without the forbidden configuration of "non-conducting state" for both NVM devices. The positive voltage $V_{DD}$ for the logic core voltage rail is between 0.9V to 1.2V such that the read disturbance of the floating gate non-volatile devices does not occur for passing $V_{DD}$. The core logic voltage signals $V_{DD}$ and $V_{SS}$ are applied to turn "off" and "on" the PMOSFET core devices in the CAM cells respectively. For searching a digital content to match the configured non-volatile digital content, a string of input digital signals containing multiple "0"s and "1"s are applied to multiple B (1:n) and $\overline{B}$ (1:n) according to their digital values shown in FIG. 16. When not-matched bits occur in a row of CAM cells, $V_{DD}$ at the output node of the non-volatile complementary pairs is passed to turn off the PMOSFET devices in the not-matched CAM cells to electrically break up the match lines for the rows shown in FIG. 16. For a full digital content match or partial match with "don't care" bits, the non-volatile complementary pairs pass $V_{SS}$ to turn "on" the entire PMOSFET devices 830 in their matched CAM cells in the row. The match line in the matched row is electrically connected.

The match line for each row is connected to a match detector consisting of an NMOSFET device 161 for grounding the match line to $V_{SS}$, an inverter 162 for sensing the match line voltage potential, and a data flip-flop 163 to catch the matching data in the left portion of match detectors in FIG. 16. When the match enable signal at the node 165 (MtchEnb) is not activated by $V_{SS}$ for its default digital value "0", the match detectors for all the rows in the array 160 are disabled and all the NMOSET devices 161 in the array 160 are "on" for grounding the match line voltage potential to $V_{SS}$. When the MtchEnb node 165 is turned to $V_{DD}$ for a search operation, the PMOSFET device 164 is turned on to electrically connect the Common Source Line (CSL) for vertically connecting the left nodes of the match lines to the positive potential $V_{DD}$ shown in FIG. 16. The NMOSFET devices 161 are off during the search operation to prevent any DC current paths for the match detectors through the match lines. The voltage potentials at the match lines for not-matched rows remain at $V_{SS}$ to form electrically broken match lines. The not-matched signal $V_{DD}$ through the inverter 162 from the not-matched rows is captured in the data flip-flop 163. The signal captured in the data flip-flop 163 is then $V_{DD}$ for the not-matched rows for the search operation. For a matched row of fully electrically connected match line, the voltage potential at the match line and detector input node is charged from ground to $V_{DD}$. The signal captured in the data flip-flop 163 is $V_{SS}$ for the matched row for the search operation. The digital data signals captured in the data flip-flops 163 can be applied to switching on a data pathway or triggering to execute a set of computing instructions for the input digital content matched with a configured non-volatile digital content.

The aforementioned description of the preferred embodiments of the invention has been presented for purposes of illustration and description. It is not intended to be exhaustive or to limit the invention to the precise form or to exemplary embodiments disclosed. Accordingly, the description should be regarded as illustrative rather than restrictive. Obviously, many modifications and variations of non-volatile memory elements including the types of non-volatile memory devices such as the conventional MOSFET devices with floating gate, charge trap dielectrics, or nanocrystals for charge storage material, and the non-volatile memory devices having the "conducting" and "non-conducting" states to form a complementary pair such as Phase Change Memory (PCM), Programmable Metallization Cell (PMC), Magneto-Resistive Random Memories (MRAM), Resistive Random Access Memory (RRAM), and Nano-Random Access Memory (NRAM) will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A nonvolatile content addressable memory (NVCAM), comprising:
   a NOR-type match line non-volatile memory array having a plurality of NVCAM cells organized in rows and columns, each NVCAM cell comprising a switching transistor;
   a plurality of match lines extending horizontally, each match line being connected to the NVCAM cells in a corresponding row; and
   a plurality of bit line pairs and common source lines extending vertically, each bit line pair being connected to the NVCAM cells in a corresponding column, each common source line being connected to the NVCAM cells in two corresponding adjacent columns;
   wherein the NVCAM cells in each row are arranged in cell pairs such that source electrodes of the switching transistors of cell pairs in one column are connected to form a corresponding common source line and drain electrodes of the switching transistors of cell pairs in one row are connected to form a corresponding match line.

2. The NVCAM according to claim 1, wherein each NVCAM cell comprises:
   a first non-volatile memory (NVM) device and a second NVM device, the first NVM device being in one of a conducting state and a non-conducting state and the second NVM device being in one of the conducting state and the non-conducting state.

3. The NVCAM according to claim 2, wherein two first terminals of the first NVM device and the second NVM device are connected together to a gate electrode of the switching transistor, a second terminal of the first NVM device being connected to a first bit line of a corresponding bit line pair, a second terminal of the second NVM device being connected to a second bit line of the corresponding bit line pair.

4. The NVCAM according to claim 2, wherein when the states of the first NVM device and the second NVM device in one NVCAM cell match a pair of complementary binary signals on a corresponding bit line pair, its switching transistor is turned off to electrically disconnect its corresponding match line from its attached common source line, and wherein when the states of the first NVM device and the second NVM device in one NVCAM cell do not match a pair of complementary binary signals on a corresponding bit line pair, its switching transistor is turned on to electrically connect its corresponding match line to its attached common source line.

5. The NVCAM according to claim 1, wherein when each switching transistor is N-type, the common source lines are coupled to a ground terminal, and wherein when each switching transistor is P-type, the common source lines are coupled to an operating voltage terminal.

6. The NVCAM according to claim 1, further comprising:
a plurality of match detectors respectively coupled to the match lines, each of the match detectors generating an output signal with one of two logic levels indicating a matching result associated with a corresponding match line; and
a first switching unit for coupling the plurality of common source lines to a first voltage terminal;
wherein the output signal is used to switch on a data pathway or trigger to execute a set of computing instructions.

7. The NVCAM according to claim 6, wherein each match detector comprises:
a second switching unit for coupling the corresponding match line to a second voltage terminal;
an inverter connected to the second switching unit; and
a flip-flop connected to the output terminal of the inverter for generating the output signal;
wherein the second switching unit is enabled while the first switching unit, the inverter and the flip-flop are disabled when no search operation is performed, and wherein the second switching unit is disabled while the first switching unit, the inverter and the flip-flop are enabled for a search operation.

8. The NVCAM according to claim 7, wherein when each switching transistor is N-type, the first voltage terminal is a ground voltage terminal and the second voltage terminal is an operating voltage terminal, and wherein when each switching transistor is P-type, the first voltage terminal is an operating voltage terminal and the second voltage terminal is a ground voltage terminal.

9. A method of operating a non-volatile content addressable memory (NVCAM) comprising a NOR-type match line non-volatile memory array having a plurality of NVCAM cells organized in rows and columns, each NVCAM cell comprising a switching transistor, the method comprising the steps of:
coupling a plurality of match lines to a first voltage terminal carrying a first voltage, each match line extending horizontally and being connected to the NVCAM cells in a corresponding row;
performing a search operation by applying an input data string to a plurality of bit line pairs and coupling a plurality of common source lines to a second voltage terminal carrying a second voltage after the step of coupling the match lines, each bit line pair extending vertically and being connected to the NVCAM cells in a corresponding column, each common source line extending vertically and being connected to the NVCAM cells in two corresponding adjacent columns, wherein the NVCAM cells in each row are arranged in cell pairs such that source electrodes of the switching transistors of cell pairs in one column are connected to form a corresponding common source line and drain electrodes of the switching transistors of cell pairs in one row are connected to form a corresponding match line; and
if the input data string does not match a stored data string in the NVCAM cells in one row, switching on at least one corresponding switching transistor to change a voltage of a corresponding match line to the second voltage, otherwise switching off all the corresponding switching transistors to maintain the corresponding match line at the first voltage.

10. The method according to claim 9, further comprising:
generating a plurality of output signals according to voltage levels of the match lines after the step of switching; and
applying the output signals to switch on a data pathway or trigger to execute a set of computing instructions;
wherein each output signal has one of two logic levels indicating a matching result associated with a corresponding match line.

11. The method according to claim 10, wherein the step of generating the plurality of output signals comprises:
respectively inverting voltage levels of the match lines into the output signals; and
storing the output signals in a plurality of flip-flops.

12. The method according to claim 9, wherein when each switching transistor is N-type, the first voltage is an operating voltage and the second voltage is a ground voltage, and wherein when each switching transistor is P-type, the first voltage is a ground voltage and the second voltage is an operating voltage.

13. The method according to claim 9, wherein each NVCAM cell comprises:
a first non-volatile memory (NVM) device and a second NVM device, the first NVM device being in one of a conducting state and a non-conducting state and the second NVM device being in one of the conducting state and the non-conducting state.

14. The method according to claim 13, wherein the input data string comprises a plurality of pairs of complementary binary signals on the bit line pairs and the stored data string comprises a specified combination of the states of the first NVM devices and the second NVM devices of the NVCAM cells in the row, and wherein the step of switching comprises:
when the states of the first NVM device and the second NVM device of one NVCAM cell in the row match a pair of complementary binary signals on a corresponding bit line pair, switching off its switching transistor to electrically disconnect the corresponding match line from its attached common source line, otherwise switching on its switching transistor to electrically connect the corresponding match line to its attached common source line.

15. The method according to claim 13, further comprising:
configuring a plurality of data strings in a plurality of rows of the NOR-type match line non-volatile memory array before the step of coupling the match lines.

16. The method according to claim 15, wherein the step of configuring comprises:
respectively programming the first NVM devices and the second NVM devices of the NVCAM cells in each row to corresponding states according to its corresponding data string.

* * * * *